United States Patent [19]

Robinson et al.

[11] Patent Number: 5,592,669

[45] Date of Patent: Jan. 7, 1997

[54] FILE STRUCTURE FOR A NON-VOLATILE BLOCK-ERASABLE SEMICONDUCTOR FLASH MEMORY

[75] Inventors: Kurt B. Robinson, Newcastle; Dale K. Elbert; Markus A. Levy, both of Citrus Heights, all of Calif.

[73] Assignee: Intel Corporation, Santa Clara, Calif.

[21] Appl. No.: 565,929

[22] Filed: Dec. 1, 1995

Related U.S. Application Data

[63] Continuation of Ser. No. 395,916, Feb. 28, 1995, abandoned, which is a continuation of Ser. No. 636,238, Dec. 31, 1990, abandoned.

[51] Int. Cl.⁶ .................................................. G06F 17/30
[52] U.S. Cl. ........................................ 395/622; 395/800
[58] Field of Search .................................. 395/600, 800; 348/231, 232

[56] References Cited

U.S. PATENT DOCUMENTS

| | | | |
|---|---|---|---|
| 4,279,024 | 7/1981 | Schrenk | 365/203 |
| 4,430,727 | 2/1984 | Moore et al. | 395/425 |
| 4,456,971 | 6/1984 | Fukuda et al. | 395/500 |
| 4,511,964 | 4/1985 | Georg et al. | 395/412 |
| 4,642,759 | 2/1987 | Foster | 395/500 |
| 4,644,494 | 2/1987 | Muller | 364/900 |
| 4,718,041 | 1/1988 | Baglee et al. | 365/185 |
| 4,755,939 | 7/1988 | Watson | 395/600 |
| 4,757,533 | 7/1988 | Allen et al. | 380/25 |
| 4,775,932 | 10/1989 | Oxley et al. | 395/600 |
| 4,797,810 | 1/1989 | McEntee | 395/600 |
| 4,800,520 | 1/1989 | Ijima | 235/382 |
| 4,802,117 | 1/1989 | Chrosny et al. | 364/900 |
| 4,896,262 | 1/1990 | Wayama et al. | 395/500 |
| 4,958,315 | 7/1990 | Balch | 395/500 |
| 4,984,149 | 1/1991 | Iwashita et al. | 395/404 |
| 5,012,425 | 4/1991 | Brown | 364/464.02 |
| 5,047,989 | 9/1991 | Canepa et al. | 365/238.5 |
| 5,053,990 | 10/1991 | Kreifels et al. | 395/430 |
| 5,070,474 | 12/1991 | Tuma et al. | 395/500 |
| 5,077,737 | 12/1991 | Leger et al. | 371/10.1 |
| 5,101,490 | 3/1992 | Getson, Jr. et al. | 395/425 |
| 5,111,385 | 5/1992 | Hattori | 395/425 |
| 5,131,089 | 7/1992 | Cole | 395/500 |
| 5,163,021 | 11/1992 | Mehrotra et al. | 365/185 |
| 5,193,184 | 3/1993 | Belsan et al. | 395/404 |

(List continued on next page.)

FOREIGN PATENT DOCUMENTS

| | | |
|---|---|---|
| 2088442 | 1/1993 | Canada . |
| 0175458 | 3/1986 | European Pat. Off. . |
| 0392895 | 10/1990 | European Pat. Off. . |
| 58-215795 | 12/1983 | Japan ................. G11C 17/00 |
| 58-215794 | 12/1983 | Japan . |
| 62-283497 | 12/1987 | Japan . |
| 62-283496 | 12/1987 | Japan . |
| 63-183700 | 7/1988 | Japan . |
| 59-162695 | 9/1994 | Japan . |

OTHER PUBLICATIONS

French Patent Office Preliminary Search Report, dated Oct. 19, 1995, for French counterpart patent Application No. 9116233.

(List continued on next page.)

*Primary Examiner*—Thomas G. Black
*Assistant Examiner*—Paul R. Lintz
*Attorney, Agent, or Firm*—Blakely, Sokoloff, Taylor & Zafman

[57] ABSTRACT

A non-volatile semiconductor memory that is erasable only in blocks is described. Each bit of the non-volatile semiconductor memory cannot be overwritten from a first logical state to a second logical state without a prior erasure. Each bit of the non-volatile semiconductor memory can be overwritten from a second logical state to a first logical state without a prior erasure. The non-volatile semiconductor memory comprises an active block for storing a first file, a reserve block for storing a second file, and a directory block. The second file is a copy of the first file. The copy is made during a clean-up operation prior to erasure of the active block. The directory block comprises a directory entry for identifying the first file.

16 Claims, 11 Drawing Sheets

U.S. PATENT DOCUMENTS

| | | | |
|---|---|---|---|
| 5,200,959 | 4/1993 | Gross et al. | 371/21.6 |
| 5,210,866 | 5/1993 | Milligan et al. | 395/182.04 |
| 5,226,168 | 6/1993 | Kobayashi et al. | 395/800 |
| 5,268,870 | 12/1993 | Harari | 365/218 |
| 5,297,029 | 3/1994 | Nakai et al. | 365/238.5 |
| 5,297,148 | 3/1994 | Harari et al. | 371/10.2 |
| 5,301,288 | 4/1994 | Newman et al. | 395/412 |
| 5,321,834 | 6/1994 | Weiser et al. | 395/600 |
| 5,341,339 | 8/1994 | Wells | 365/218 |
| 5,392,427 | 2/1995 | Barrett et al. | 395/600 |
| 5,398,142 | 3/1995 | Davy | 360/48 |

OTHER PUBLICATIONS

K. Robinson, "Trends in Flash Memory System Design," Wescon Conference, Record 34, Nov. 1990, pp. 468–472.

Ron Wilson, "1–Mbit Flash Memories Seek Their Role in System Design," *Computer Design*, vol. 28, No. 5, Mar. 1, 1989, pp. 30–31.

Bernard C. Cole, "Seeq Pushes Flash Memory to 1 Megabit," *Electronics*, vol. 62, No. 3, Mar., 1989, p. 85.

Bernard C. Cole, "How the US is Leading the Way in Strategic Nonvolatile Technology," *Electronics*, vol. 62, No. 3, Mar. 1989, pp. 80–83.

Carl Olsen, "Letters From Around the World With a Laptop," *PC Computing*, vol. 2, No. 7, Jul. 1989,. pp. 108–122.

Michael C. Markowitz, "Nonvolatile Memories," *EDN*, vol. 34, No. 18, Sep. 1, 1989, pp. 94–100, 102, 104.

Daly et al., "Lightweight Laptops Make Hefty Boasts," *Computerworld*, Sep. 18, 1989, p. 1.

Michael Bloom, "A Memory to Remember," *ESD: The Electronic System Design Magazine*, vol. 19, No. 10, Oct. 1989, pp. 38–42.

Jonathan Matzkin, "Tiny, Powerful Poqet PC Tips the Scales at 1 lb.," *PC Magazine*, vol. 8, No. 19, Nov. 14, 1989, pp. 33, 35.

Alfred Rosenblatt, "Make Room For Pocket Computers," *Electronics*, vol. 62, No. 11, Nov., 1989, pp. 93–96.

D. A. Patterson, J. L. Hennessy, and D. Goldberg, *Computer Architecture a Quantitative Approach*, Morgan Kaufmann Publishers, Inc., p. 519 (1990).

R. D. Pashley and S. K. Lai, *Flash Memories: The Best of Two Worlds*, IEEE Spectrum, pp. 30–33 (Dec. 1989).

M. A. Levy and D. Elbert, *Solutions for High Density Applications Using Intel Flash Memory* (Oct. 1990), *1991 Memory Products Handbook*, Intel Corporation, pp. 6–297 through 6–344 (1990).

S. Zales, *Flash Memory Outshines ROM and EPROM*, EETimes (May 1990), *1991 Memory Products Handbook*, Intel Corporation, pp. 6–411 through 6–416 (1990).

R. Pashley, Nonvolatility: *Semiconductor vs. Magnetic*, IEEE, International Solid–State Circuits Conference (Feb. 17, 1988), *1991 Memory Products Handbook*, Intel Corporation, pp. 6–393 and 6–394 (1990).

M. Levy, *Flash Memory Operates 10–20 Times Longer*, Computer Technology Review (Aug. 1990), *1991 Memory Products Handbook*, Intel Corporation, pp. 6–417 and 6–418 (1990).

D. Lammers, *PC Standard in the Cards*, EETimes (May 1990), *1991 Memory Products Handbook*, Intel Corporation, pp. 6–407 through 6–410 (1990).

*Memory Breakthrough Drives Minaturization*, Portable Computing (Oct. 1990) *1991 Memory Products Handbook*, Intel Corporation, pp. 6–419 and 6–420 (1990).

S. Baker, *Silicon Bits, The Memory Driver, 1991 Memory Products Handbook*, Intel Corporation, p. 6–399 (1990).

D. Verner, *Designing an Updatable BIOS Using Flash Memory, 1991 Memory Handbook*, Intel Corporation, pp. 6–248 through 6–296 (Oct. 1990).

Data Sheets for the iMC001FLKA and the iMC004FLKA, *1991 Memory Products Handbook*, Intel Corporation, pp. 6–143 through 6–202 (Oct. 1990).

C. Townsend, *Advanced MS–DOS Expert Techniques for Programmers* pp. 1–63 (Howard W. Sams & Company 1989).

FIG_1 (PRIOR ART)
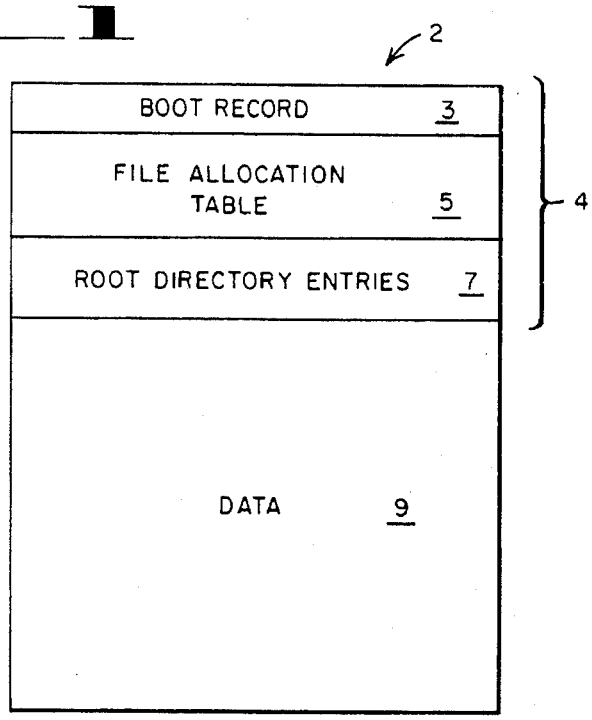
FIG_2
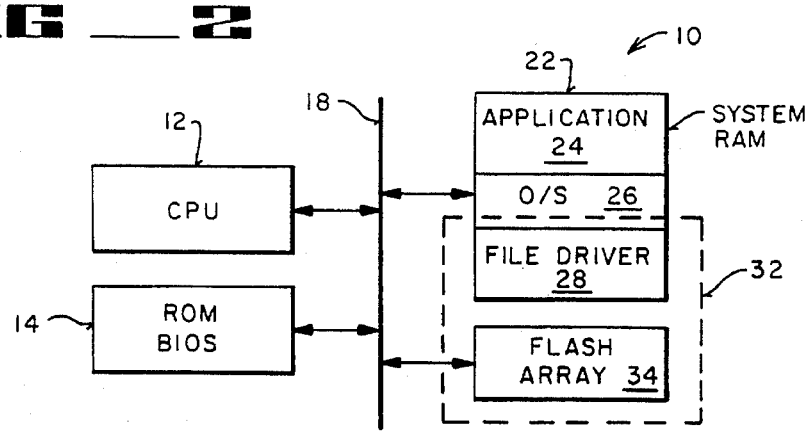
FIG_3
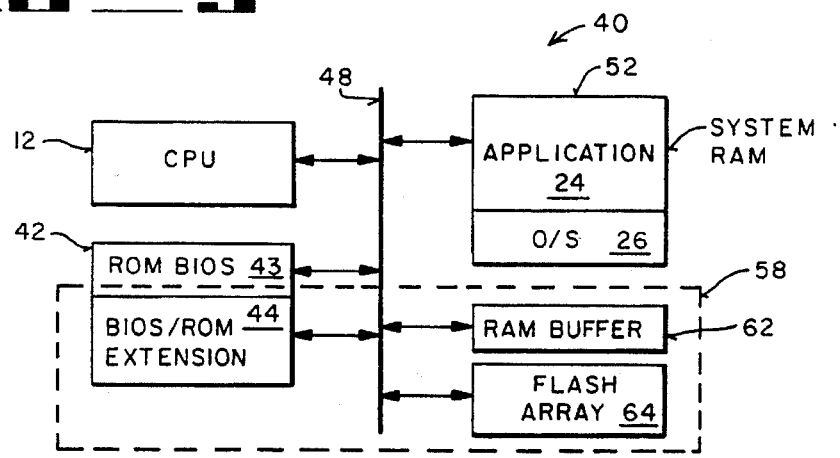

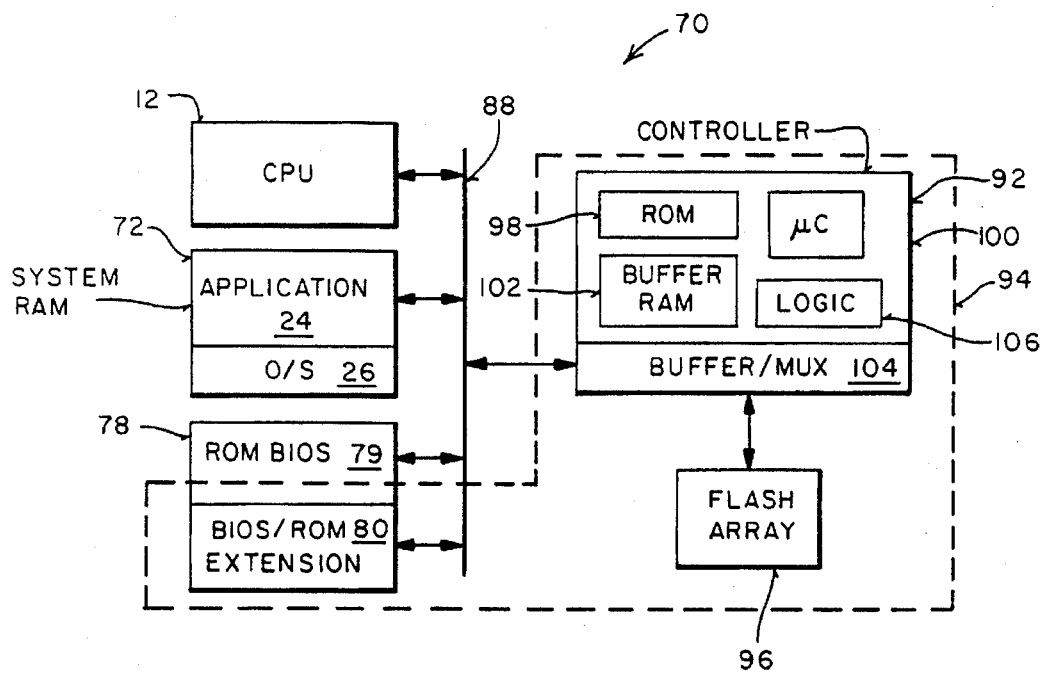
FIG_4
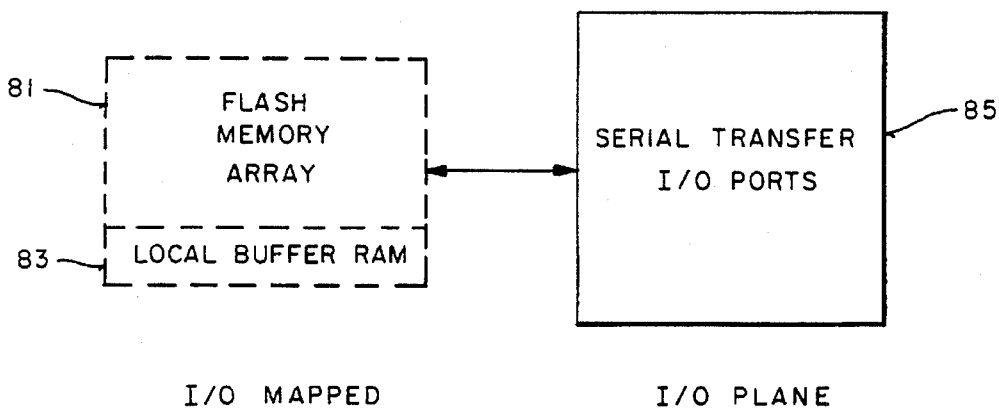
FIG_5
I/O MAPPED    I/O PLANE

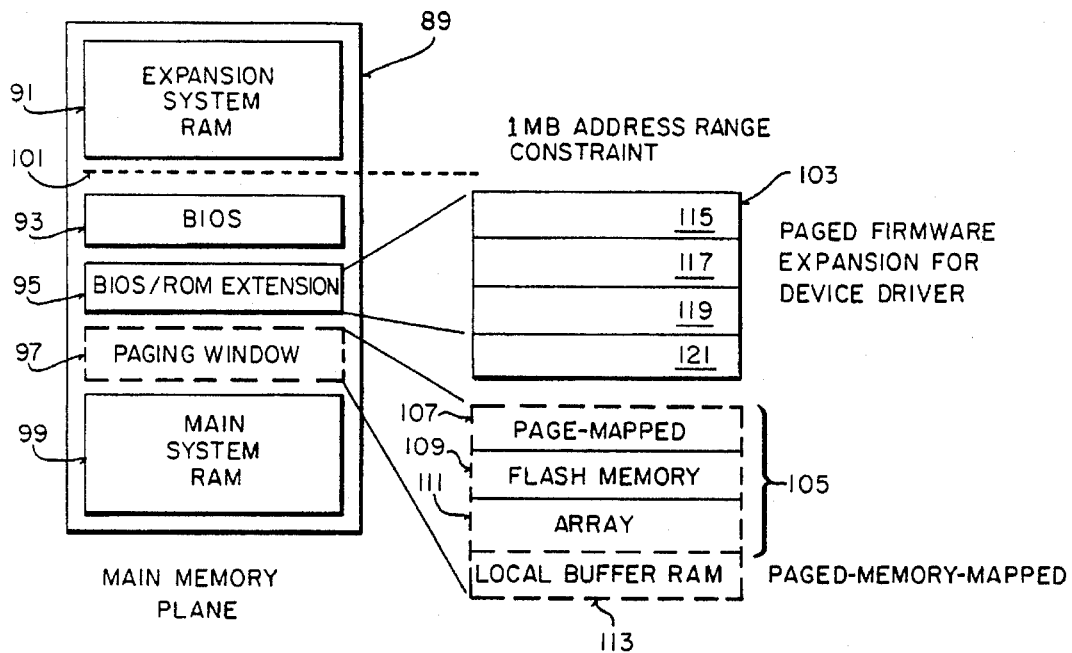
FIG_6
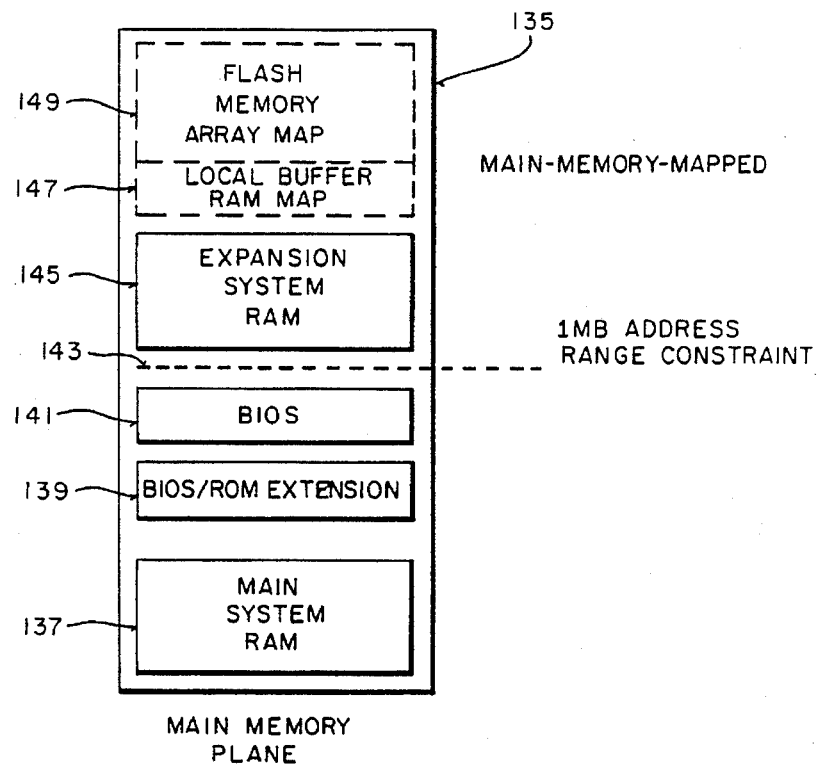
FIG_7

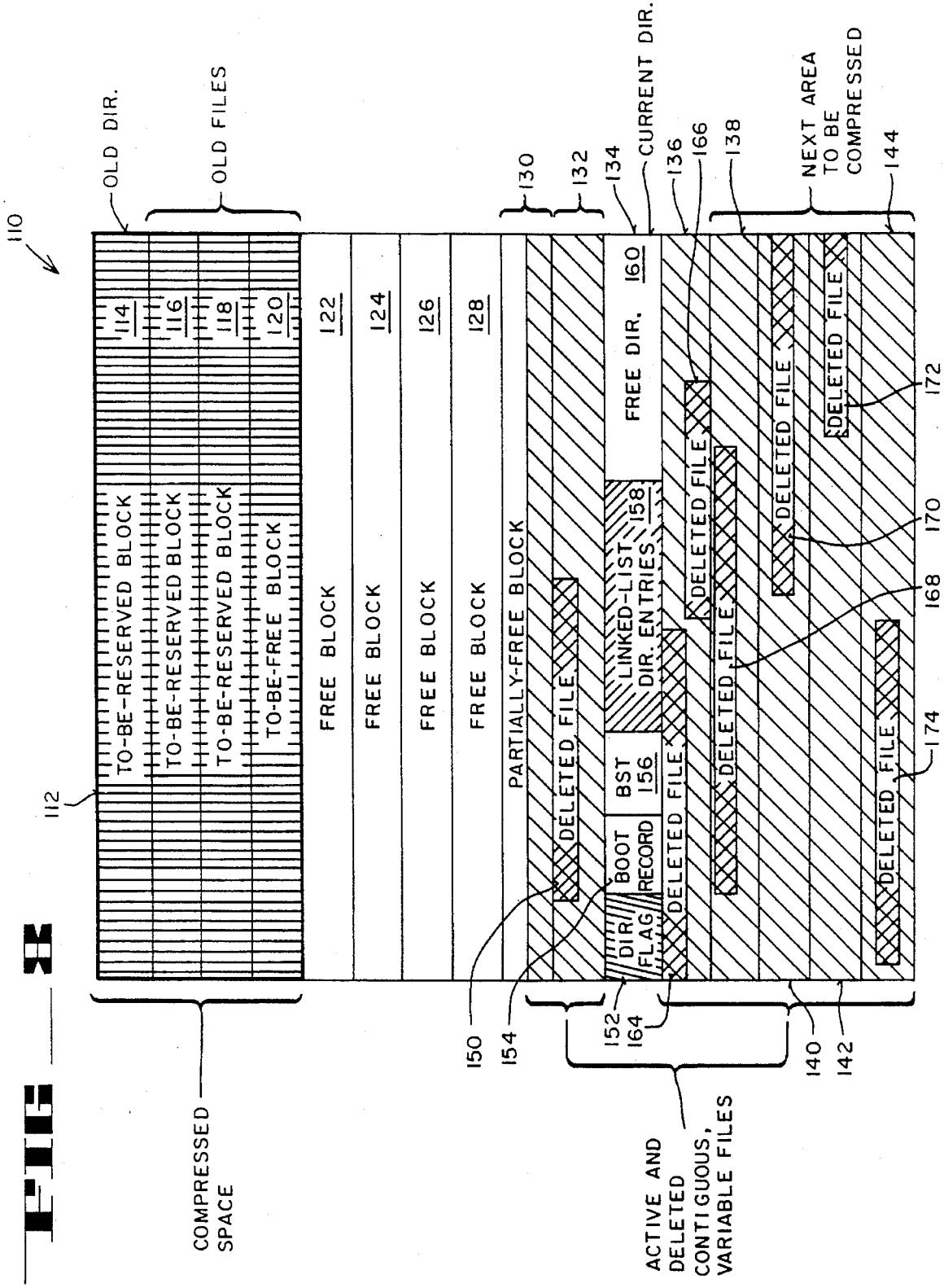

FIG_9
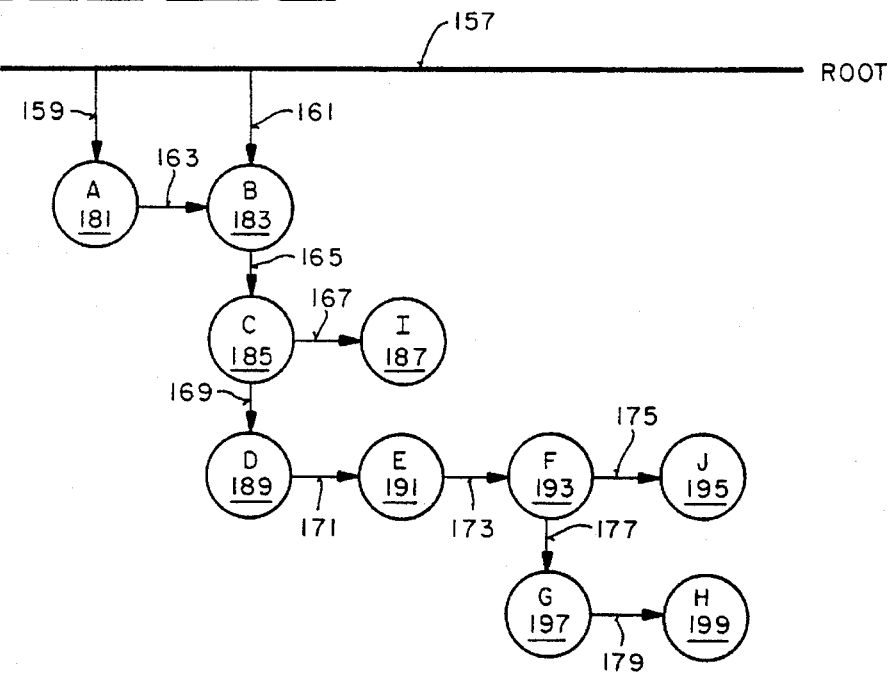
FIG_10
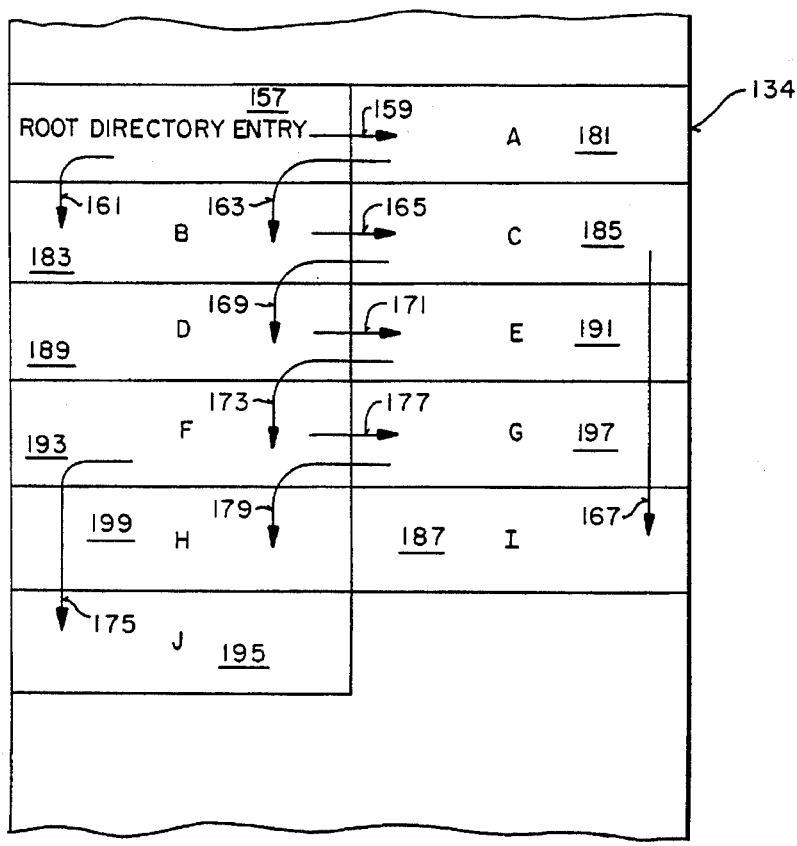

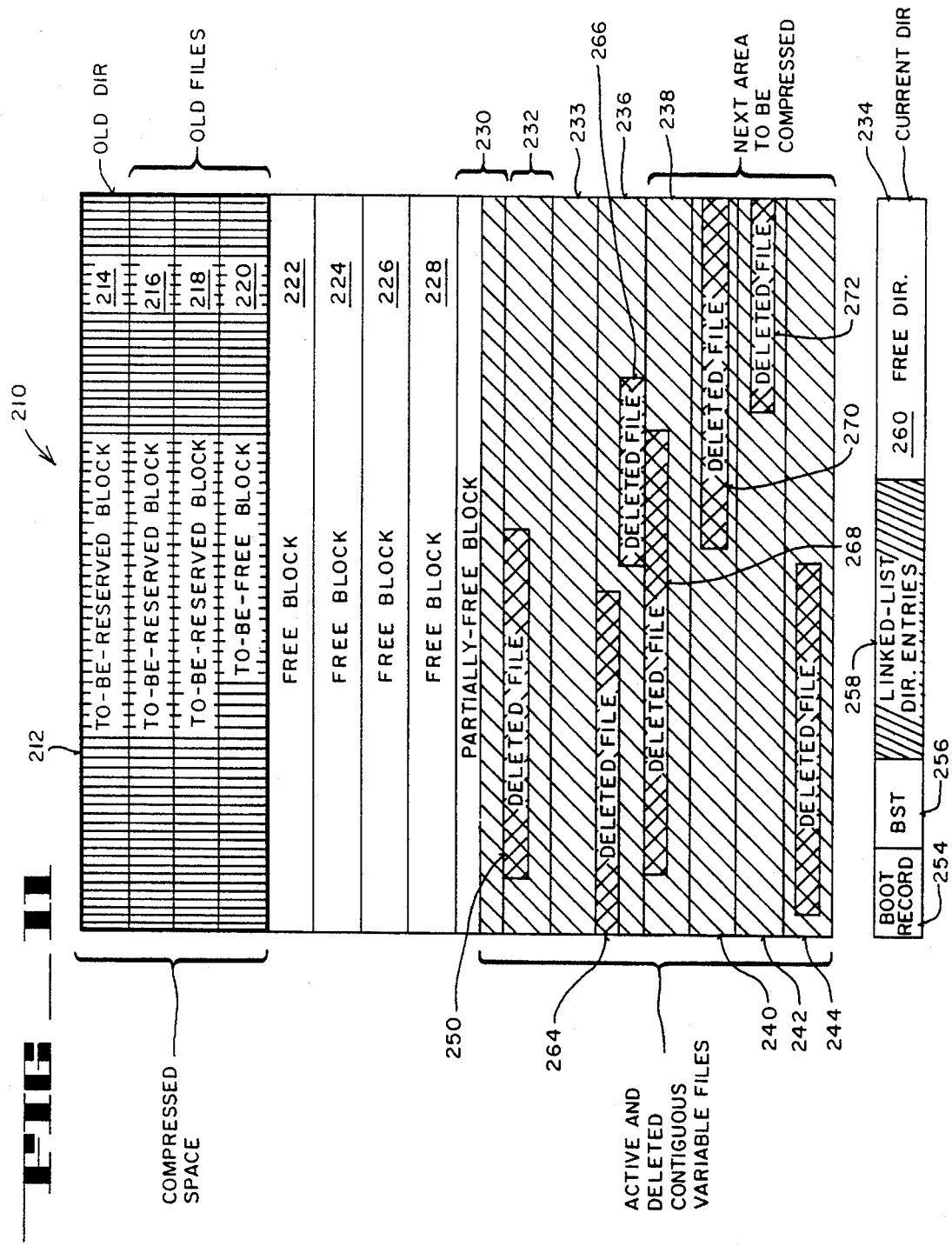

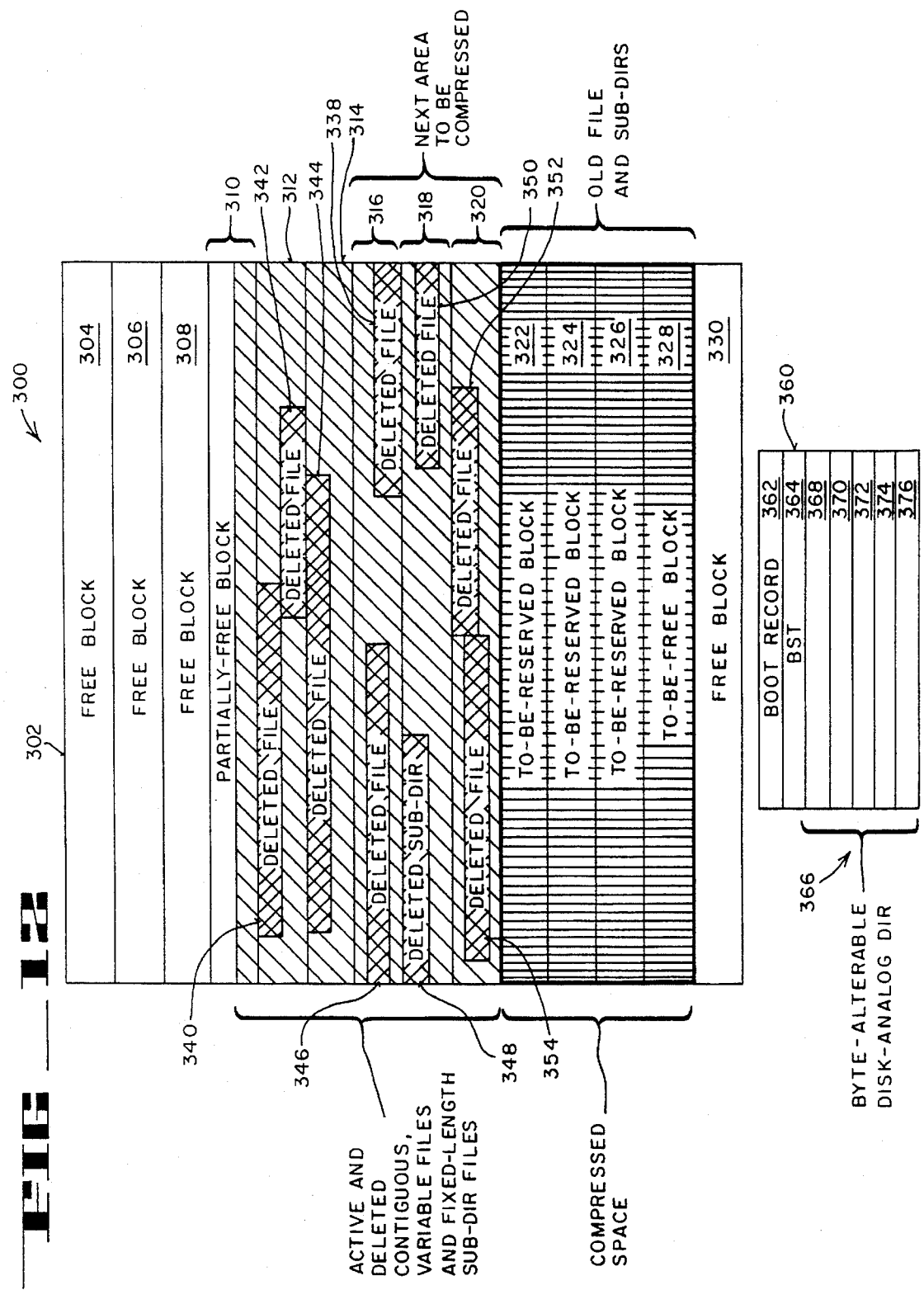

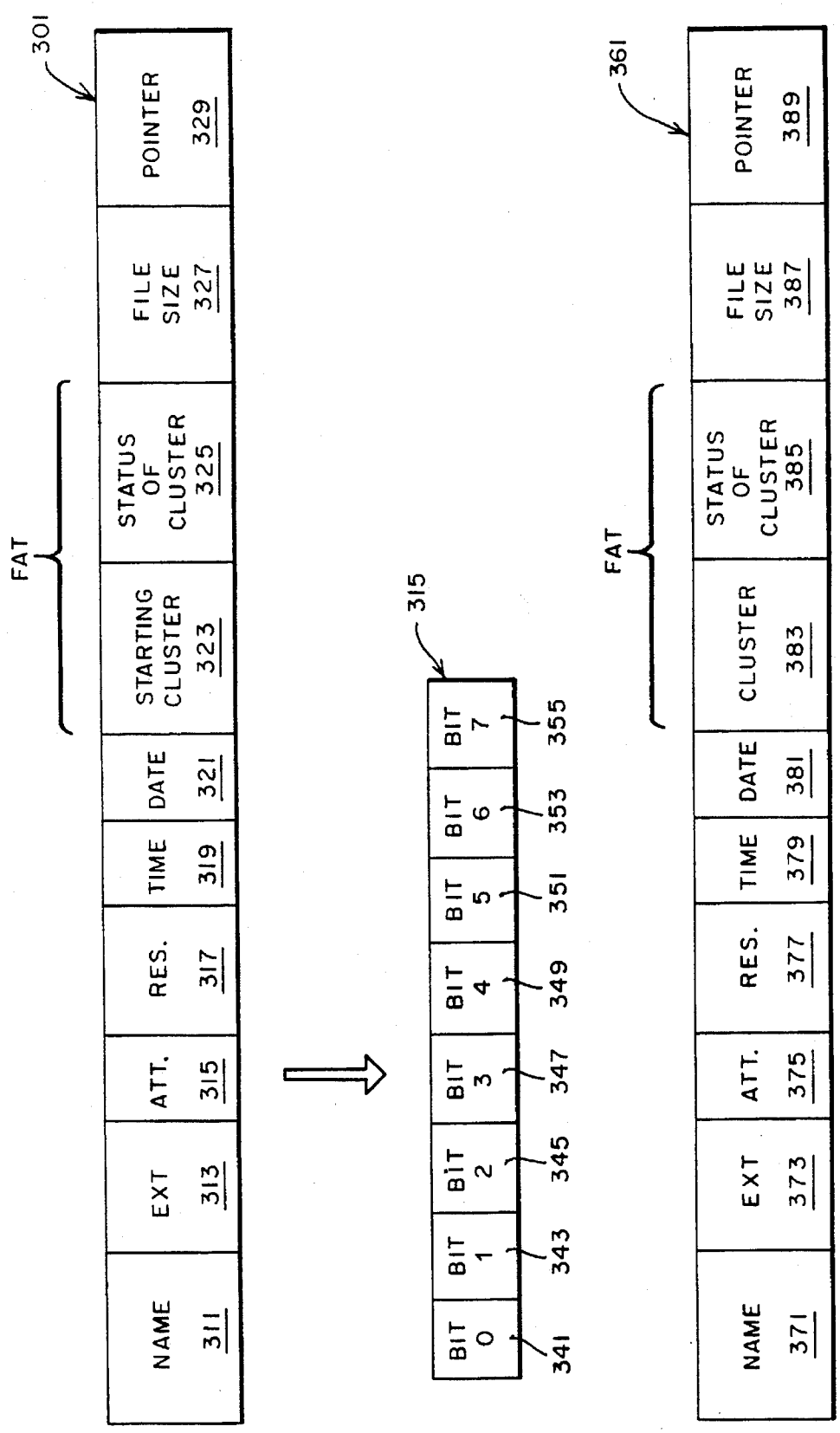

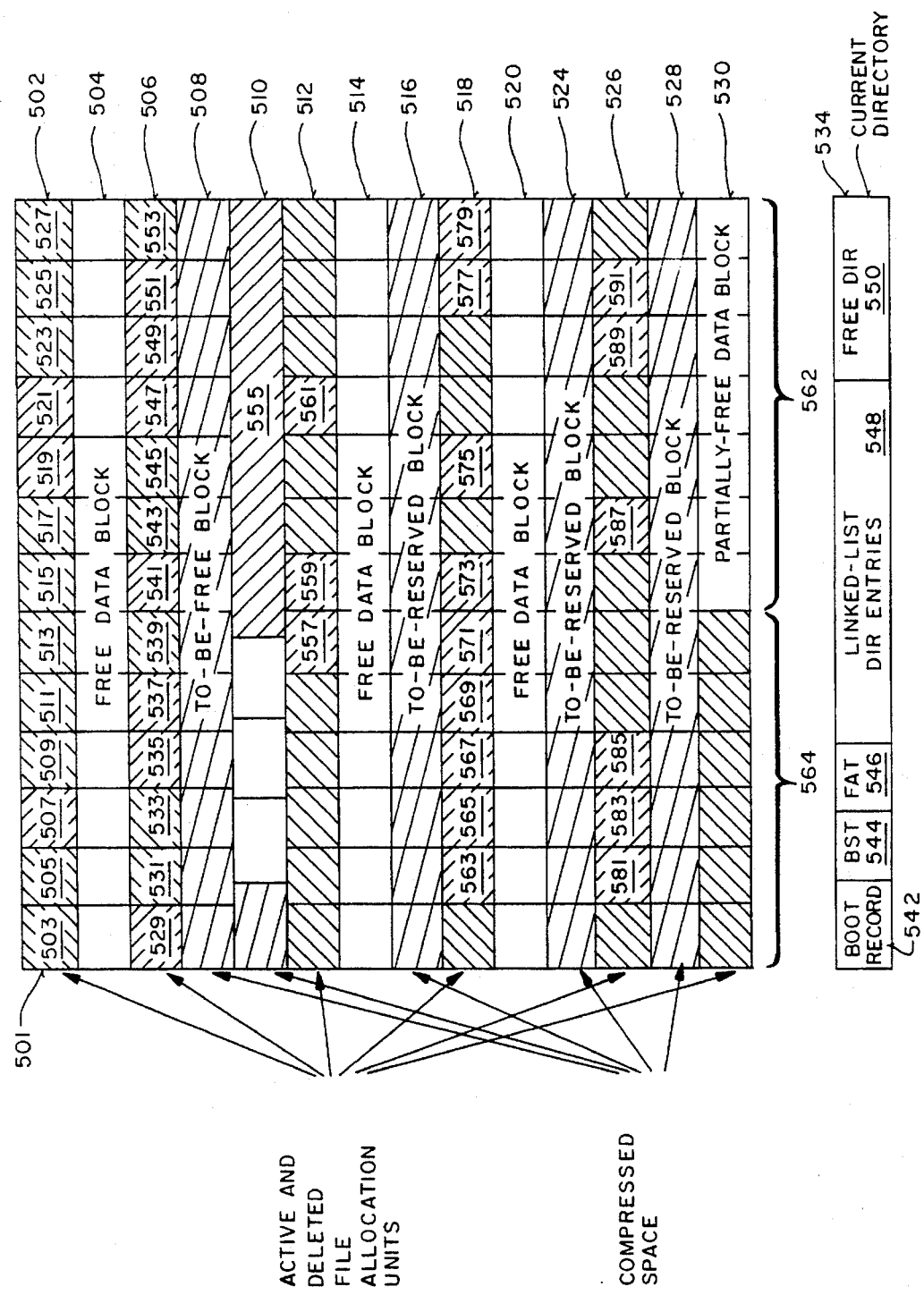

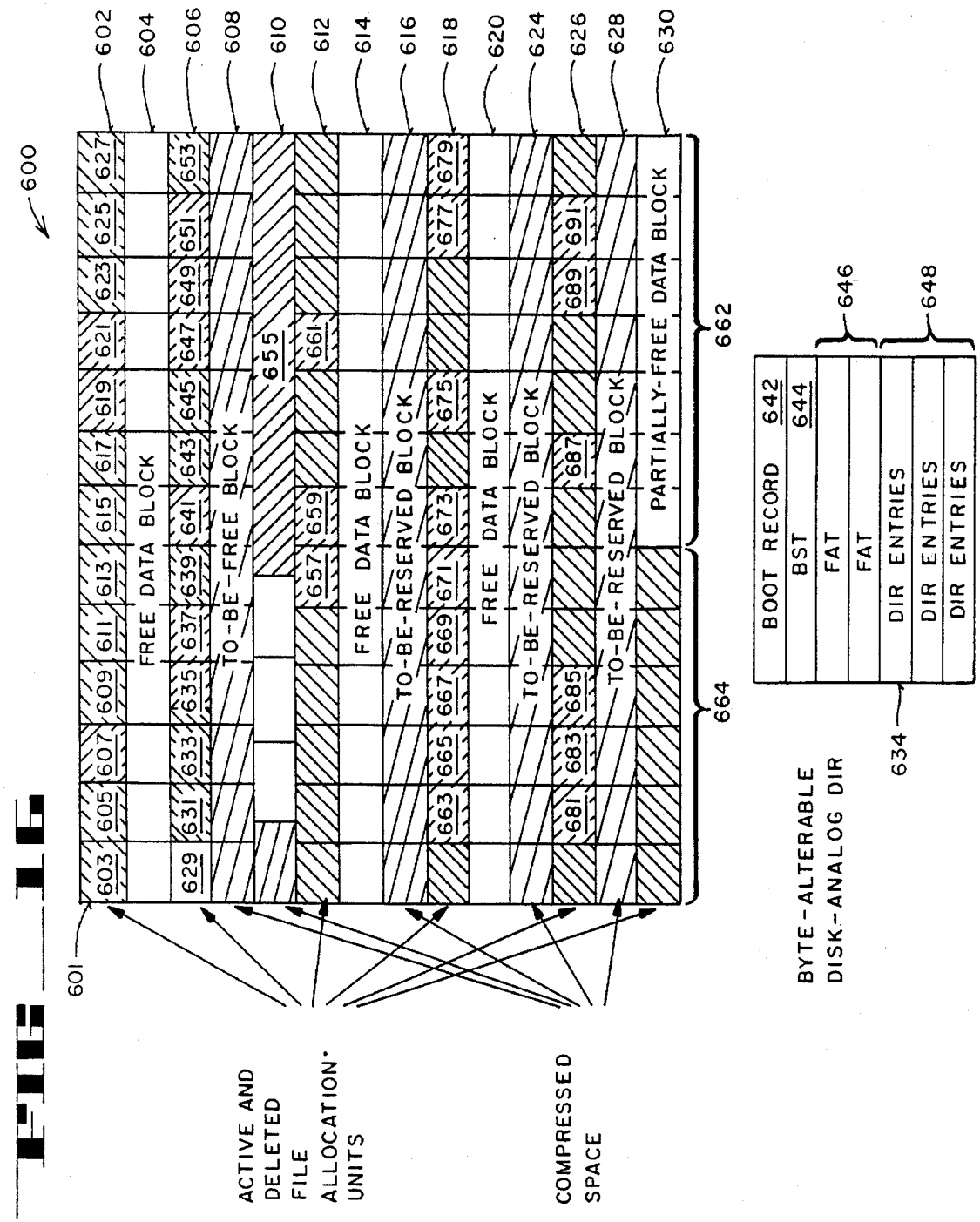

1

FILE STRUCTURE FOR A NON-VOLATILE BLOCK-ERASABLE SEMICONDUCTOR FLASH MEMORY

This is a continuation of application Ser. No. 08/395,916, filed Feb. 28, 1995, now abandoned which is a continuation of application Ser. No. 07/636,238, filed Dec. 31, 1990 now abandoned.

FIELD OF THE INVENTION

The present invention pertains to the field of the architecture of computer storage systems. More particularly, the present invention relates to a file storage systems for a large-block erasable non-volatile semiconductor memory.

BACKGROUND OF THE INVENTION

Certain types of prior personal computer systems include a microprocessor (also referred to as a central processing unit) that is coupled to several types of storage systems—namely, a read only memory ("ROM"), a random access memory ("RAM"), a hard (i.e., fixed) disk drive for mass storage, and a floppy disk drive or drives for storage on removable magnetic floppy disks. The floppy disks are also referred to as diskettes. Those prior personal computer systems typically have an architecture that is especially geared to the storage systems that form a part of each of those prior personal computer systems.

A ROM in conjunction with a program called a ROM monitor stored in the ROM is referred to as firmware. A ROM basic input/output system ("BIOS") module is one type of ROM monitor that is stored in the ROM and used by the operating system for certain personal computers. The ROM BIOS module typically contains (1) drivers for certain hardware, including the keyboard, the disk drives, and the printer; (2) a power-on self-test program ("POST"); (3) a start-up routine that initializes the system; and (4) a loader program that reads the boot or first sector from a diskette or a hard disk.

After the personal computer is turned on, the POST program of the BIOS module is executed, the BIOS start-up routine performs certain initializations, and the loader program reads the contents of the boot sector from a diskette or from a hard disk. That boot sector contains a loader program of the operating system of the computer. That loader program of the operating system in turn loads part of the operating system from a diskette or a hard disk into RAM.

The operating system for the personal computer processes commands, controls program execution, and oversees the hardware and software resources of the computer system. One type of prior art operating system is MS-DOS sold by Microsoft Corporation of Redmond, Wash. The MS-DOS operating system includes the loader program discussed above, the MS-DOS BIOS, an MS-DOS kernel, a user interface, and utility programs.

The MS-DOS BIOS includes (1) new drivers that extend and use components of the drivers of the ROM BIOS; (2) an initialization routine for the MS-DOS BIOS drivers; and (3) another loader program.

The new drivers of the MS-DOS BIOS are also referred to as BIOS extensions or BIOS ROM extensions. In certain prior art personal computers, all input and output functions are driven by software contained in a 32 kilobyte or 64 kilobyte section of ROM and by smaller (typically 2 kilobyte) BIOS ROM extensions.

The initialization routine for the MS-DOS BIOS drivers displays a copyright notice and adjusts the interrupt table for the new drivers.

The loader program of the MS-DOS BIOS loads the rest of the operating system.

The MS-DOS kernel is a shell between the BIOS and the application program. The MS-DOS kernel initiates application program execution, allocates memory for the application programs, provides an application program interface between the application program and the hardware, and manages the reading and writing of the files.

The user interface of MS-DOS provides information to the user. The user interface provides a prompt, which prompts the user to enter commands. The user interface acts as the manager of the system when the operating system is in control.

The utility programs of MS-DOS provide certain useful functions for MS-DOS. Those functions include (1) formatting a diskette or a hard disk and (2) checking a diskette or a hard disk.

The hard disk and diskettes used with the above-referenced personal computer system are non-volatile storage systems, which means that data is not lost when the power to the computer is turned off. The hard disk and diskettes are types of block storage devices, which means that data is transferred to and from them in blocks.

On the hard disk and on the diskettes, data is physically stored on concentric tracks. Each track is made up of a plurality of sectors. A sector is typically fixed at 512 bytes in length. A disk controller and a physical device driver of a personal computer system typically always write to and read from disks in sector entities.

A cluster is the smallest logically addressable storage unit. For some hard disks, there are four sectors per cluster. For some other hard disks and for a high density 3.5 inch diskette, a cluster is a single sector.

Each partitioned area of a hard disk forms a logical subsystem that can contain its own operating system. A partition table in the first sector of a formatted hard disk contains information about the partitions.

A hard disk and a diskette are formatted before first being used. Low-level formatting divides each track into sectors and places identification ("ID") sector headers at uniform positions around the track. A high-level formatting establishes the clusters, initializes some disk areas, and prepares the disk for receiving data.

At the device driver and the BIOS level, disk requests are described by a "tuple" that indicates the drive, the head, the cylinder/track, the sector, and the length. The logical sector numbers are known at the DOS level and BiOS level. DOS reads and writes to disks in cluster entities.

FIG. 1 shows the logical organization of a prior art MS-DOS operating system. For the MS-DOS operating system, a disk 2 is divided into two logical areas: a system area 4 and a data area 9. The system area contains a boot record 3, a file allocation table FAT 5, and a root directory 7 that contains the root directory entries. The data area 9 contains files that are used to store application programs, data, and subdirectory information.

The boot record 3 includes a bootstrap loader program for loading the operating system. The boot record 3 also includes information as to the ASCII name of the formatting DOS, the number of bytes per sector of the disk, the number of sectors per cluster, the number of sectors in the boot record, the number of copies of the file allocation table, the number of root directory entries, the number of sectors per partition, the disk type number, the number of sectors per file allocation table entry (or cluster), the number of sectors per track, the number of sides per disk, the number of reserved or hidden sectors, the physical drive number, an extended boot sector signature, a volume identification, and a volume table.

The root directory 7 is a table of 32-byte entries that each set forth certain attributes of the file. Typically, each directory entry making up the root directory 7 includes a file name, a file extension, attribute flags, time and date stamps for the file, the starting cluster number for the clusters that make up the file, and the file size.

Each file on the disk is made up of one or more clusters. The file allocation table 5 contains a record in the form of a chain of how the clusters making up the file are linked together. A typical FAT 5 contains a list of two-byte entries, one for each cluster. For some prior FATs, the FAT entries are longer than two bytes. The length of each FAT entry depends upon the total number of clusters. The directory entry for a file contains the starting cluster number for the file, and the operating system uses that starting cluster number to access the file allocation table. Each FAT entry is a pointer to the next cluster of the file. Thus, the FAT entry retrieved by that first access contains the cluster number of the next cluster making up the file. The operating system uses that next cluster number to access the FAT to retrieve yet another cluster number, and continues this process until a special marker in FAT 5 is reached.

The file structure on the disk is tree-like. Entries in the root directory can be pointers to subdirectories. The subdirectories can be nested.

One disadvantage associated with the use of hard disks and diskettes in certain types of prior personal computers is that hard disk drives and floppy disk drives are relatively physically large devices with a number of mechanical components. Such large sizes contrast with the small size of integrated circuits that make up many other parts of a personal computer. Moreover, the relatively large size of typical prior hard disk drives and floppy disk drives hinders portable personal computers from being even smaller and more portable.

Another disadvantage associated with prior hard disk drives and floppy disk drives is that they consume a relatively large amount of power compared with the integrated circuits making up other parts of the personal computer.

A further disadvantage associated with the prior hard disk drives and floppy disk drives is that they are prone to failure if exposed to excessive shock and vibration or to dust or other atmospheric contaminants.

Another type of prior non-volatile computer memory is the flash electrically erasable programmable read-only memory ("flash EEPROM"). The flash EEPROM can be programmed by the user, and once programmed, the flash EEPROM retains its data until erased. Electrical erasure of the flash EEPROM erases the entire contents of the memory of the device in one relatively rapid operation. The flash EEPROM may then be programmed with new code.

One disadvantage of one type of prior flash EEPROM, however, is that each single bit cell cannot be overwritten from a logical zero to a logical one without a prior erasure. Another disadvantage of one prior type of flash EEPROM is that it must be erased—i.e., reset to a logical one state—in large blocks or in a manner that erases the entire device.

Another disadvantage of one prior type of flash EEPROM is that there is a finite limit on the number of erase and write cycles for the flash EEPROM before the flash EEPROM will fail.

The limitations with respect to overwriting and erasure associated with certain prior flash EEPROMs have, in certain instances, limited the usefulness of flash EEPROMs in personal computer systems.

SUMMARY AND OBJECTS OF THE INVENTION

One of the objects of the present invention is to provide a file structure for a non-volatile semiconductor memory that is erasable only in blocks and that cannot have a bit overwritten from a first logical state to a second logical state without a prior erasure.

Another of the objects of the present invention is to provide a file structure for a non-volatile semiconductor memory that is erasable only in blocks and that cannot have a bit overwritten from a first logical state to a second logical state without a prior erasure, wherein the non-volatile semiconductor memory includes a reserve block that helps to maximize the integrity and reliability of the file structure.

Another of the objects of the present invention is to provide a computer system that includes a non-volatile semiconductor memory that is erasable only in blocks and that cannot have a bit overwritten from a first logical state to a second logical state without a prior erasure, wherein the non-volatile semiconductor memory comprises an active block, a reserve block, and a directory block.

A non-volatile semiconductor memory that is erasable only in blocks is described. Each bit of the non-volatile semiconductor memory cannot be overwritten from a first logical state to a second logical state without a prior erasure. Each bit of the non-volatile semiconductor memory can be overwritten from a second logical state to a first logical state without a prior erasure. The non-volatile semiconductor memory comprises an active block for storing a first file, a reserve block for storing a second file, and a directory block. The second file is a copy of the first file. The copy is made during a clean-up operation prior to erasure of the active block. The directory block comprises a directory entry for identifying the first file.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which:

FIG. 1 shows the logical organization of a prior art operating system.

FIG. 2 shows a personal computer system with a flash array and with a file system driver stored in the RAM of the computer system.

FIG. 3 illustrates a personal computer system that includes (1) a flash memory array, (2) a file system driver contained within the ROM BIOS and the ROM BIOS extension, and (3) a RAM buffer for transferring files and for updating a directory of files.

FIG. 4 shows a personal computer system that includes a (1) flash memory array, (2) a file system driver stored in the ROM BIOS and the ROM BIOS extension, and (3) a separate system controller.

FIG. 5 shows an input/output mapped flash memory array.

FIG. 6 shows a paged mapped flash memory array structure.

FIG. 7 shows a direct memory mapped flash memory array structure.

FIG. 8 shows a flash EEPROM with a variable file structure and a dynamic directory.

FIG. 9 shows the logical arrangement of an example of a linked-list directory.

FIG. 10 shows the physical location of an example of a linked-list directory.

FIG. 11 shows a flash EEPROM with a variable file structure and a separate EEPROM for storing a directory.

FIG. 12 shows a flash EEPROM with a variable file structure and a separate EEPROM for storing a disk-analog directory.

FIG. 13 shows two directory/FAT entries.

FIG. 15 shows a flash EEPROM with a sectored file structure and a separate EEPROM for storing a directory.

FIG. 16 shows a flash EEPROM with sectored file structure and a separate EEPROM for storing a disk-analog directory.

DETAILED DESCRIPTION

Figure 14:
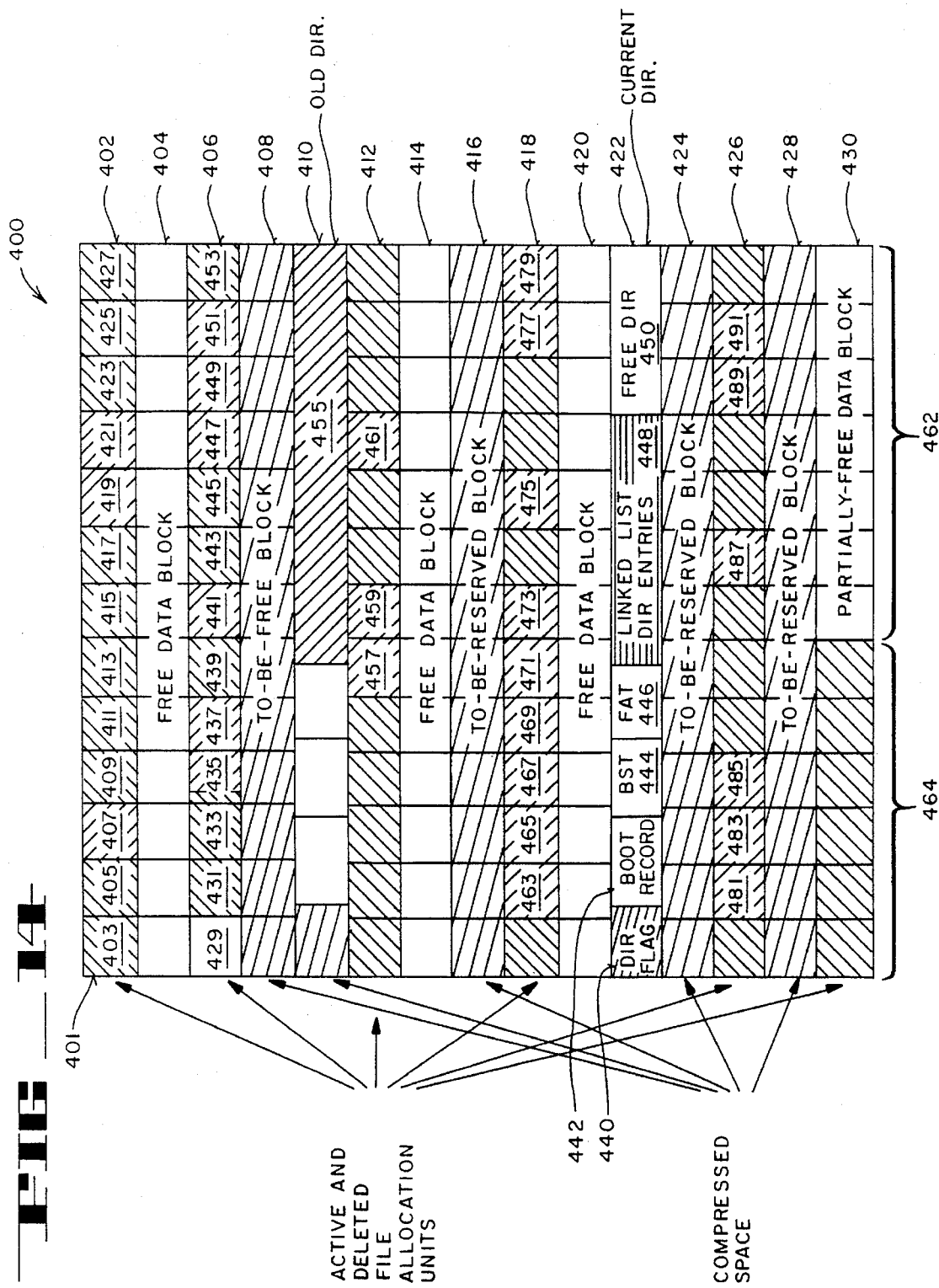
FIG. 14 shows a flash EEPROM with a sectored file structure and a dynamic directory.

FIG. 2 shows a personal computer system 10 with one preferred file system or structure 32. The file system 32 includes one or more flash EEPROMs that form flash memory array 34. A flash EEPROM is one type of semiconductor memory. File structure 32 also includes a software file system driver 28 that is stored in system RAM 22. Personal computer system 10 also includes central processing unit ("CPU") 12 and bus 18.

As described in more detail below, flash memory array 34 is structured to allow dynamic memory reallocation. Flash memory array 34 has either a variable file structure or a sectored file structure. Either a linked-list directory or a disk analog directory is used in conjunction with flash memory array 34. The disk analog directory resides in a separate memory, such as a byte-erasable EEPROM. The linked-list directory either resides on the flash memory or on a separate memory, such as a byte-erasable EEPROM.

System RAM 22 includes space for storage of application program 24. In one embodiment of the present invention, system RAM 22 is one megabyte in size. System RAM 22 also includes space for the storage of other application programs and for data. In one embodiment of the present invention, system RAM 22 includes one operating system 26 for computer system 10. In alternative embodiments, system RAM 22 further includes two or more operating systems.

System RAM 22 also includes file system driver software 28. The file system driver software 28 defines the file structure for flash memory array 34. In personal computer system 10, central processing unit 12 executes the foreground-task software routines of file system driver software 28 in order to handle all file system management utilities for flash memory array 34. The file system driver 28 and the file structure for a flash memory array are discussed in more detail below.

Not only does RAM 22 store application program 24, operating system 26, and file driver 28, but application program 24, operating system 26, and file driver 28 are also stored in flash memory array 34 during the times that computer 10 is either off or on. Flash memory array 34 can store more than one application program, more than one operating system, and more than one file driver. Flash memory array 34 also stores data files and directory information. Upon either a warm boot or a cold boot, the file system software driver 28 is loaded into system RAM 22 from flash memory array 34. In short, flash memory array acts as a mass storage device that replaces a hard disk.

Computer system 10 also includes ROM 14, which stores BIOS software for computer 10. In one embodiment of the present invention, the BIOS stored in ROM 14 includes both a 64 kilobyte BIOS with additional BIOS ROM extensions of two kilobytes each. The file system software driver 28 is stored prior to execution in flash memory array 34 rather than in ROM 14.

Upon execution of ROM BIOS program 14 after power-up of computer 10, file driver 28 and operating system 26 are loaded into system RAM 22 from flash memory array 34 via bus 18. The user of computer 10 then uses operating system 26 to load application program 24 into RAM 22. The user of computer 10 can also load data, other application programs, and other operating systems into system RAM 22.

In one embodiment of the present invention, flash memory array 34 is erased in blocks, wherein each block comprises a large number of bits. In an alternative embodiment, flash memory array 34 is erased in its entirety.

Flash memories differ from conventional electrically erasable programmable read only memories ("EEPROMs") with respect to erasure. Conventional EEPROMs use a select transistor for individual byte erase control. Flash memories, on the other hand, achieve much higher density with single transistor cells. During the erase mode, a high voltage is supplied to the sources of every memory cell in a block or in the entire chip simultaneously. This results in a full array or a full block erasure.

For flash memory array 34, a logical "one" means that few if any electrons are stored on a floating gate associated with a bit cell. A logical "zero" means that many electrons are stored on the floating gate associated with the bit cell. After flash memory array 23 has been erased, a logical one is stored in each bit cell of flash memory array 23. Each single bit cell of flash memory array 23 cannot be overwritten from a logical zero to a logical one without a prior erasure. Each single bit cell of flash memory array 23 can, however, be overwritten from a logical one to a logical zero, given that this entails simply adding electrons to a floating gate that contains the intrinsic number of electrons associated with the erased state.

Flash memory array 34 can be programmed in one of three ways: (1) a single bit at a time, (2) a single word at a time, or (3) groups of words at a time. A word consists of a plurality of memory bits associated with a single memory system address or a single device. The groups of words programmed at a time can be as large as an erase block of flash memory array 34. Program operations with respect to flash memories are also referred to as write operations.

As discussed above, each bit of flash memory array 34 cannot be overwritten from a logical zero state to a logical one state without a prior erasure. This necessity for erasure prior to overwriting from a logical to a logical one introduces a functional operation associated with a flash memory.

Flash memory array 34 stores both executable code and non-executable data. In the detailed description that follows, the generic term "data" is used to refer to either (1) non-executable data alone or (2) both executable code and non-executable data.

The read operation associated with flash memory array 34 closely resembles the read operation associated with other read-only memory devices. In one embodiment, a read operation for flash memory array 34 takes on the order of 135 nanoseconds. Write and erase operations for flash memory array 34 are, however, significantly slower. In one embodiment of the present invention, erase times for a block of flash memory array 34 are on the order of one second. Write operations for a single word of flash memory array 34 take on the order of 10 microseconds. Thus, the read, write, and erase operations associated with flash memory array 34 have an asymmetrical nature—the write and erase operations are significantly slower than the read operations.

In addition, each flash memory of flash memory array 34 has a finite endurance lifetime with respect to erase plus write (i.e., program) operations. For example, in one embodiment, flash memory array 34 can withstand a minimum of 10,000 erase/program cycles before flash memory array 34 begins to fail or exhibits erase/write performance degradation. Thus, in one embodiment of the present invention, there is a limit as to the number of erase/write cycles that flash array 34 can be put through. On the other hand, there is no such maximum lifetime with respect to the number of times flash memory array 34 can be read from.

In one embodiment of the present invention, each flash memory device comprising flash memory array 34 has multiple erase blocks within each memory device. For that embodiment, there are restrictions on the erase/programming cycling of adjacent blocks. Adjacent blocks are blocks that share either common row connections or common column connections. The restrictions on the cycling of adjacent blocks are made to prevent electrical data disturb conditions.

A more frequently cycled block is referred to a hot block. A block that is not cycled or is cycled less frequently is referred to as a cold block. The important parameter is the difference between the number of cycles associated respectively with adjacent blocks. A hot block can eventually reach a cycle count such that data is adversely affected in a cold block of flash array 34. One way to avoid this hot block/cold block interaction is to place cycle restrictions on hot blocks of flash array 34. Another way to minimize the adverse effects of hot block/cold block interaction is to periodically erase and reprogram the cold blocks of flash array 34. The periodic erase and reprogramming of cold blocks is referred to as the refreshing of cold blocks.

As described in more detail below, the preferred file structures of the present invention take into account the above-referenced functional characteristics of the flash EEPROMs that make up flash array 34.

FIG. 3 shows personal computer system 40 with one preferred file structure 58. Personal computer system 40 includes central processing unit 12 and ROM 42. ROM 42 stores BIOS software 43 and BIOS extension software 44. Personal computer system 40 also includes bus 48 and system RAM 52. System RAM 52 stores application program 24 and operating system 26. Personal computer system 40 also includes RAM buffer 62 and flash memory array 64.

RAM buffer 62 provides buffering for the transferring of files between flash memory array 64 and system RAM 52. RAM buffer 62 also provides buffering for the construction of or the updating of a directory for the files stored in flash memory array 64.

One or more flash EEPROMs make up flash memory array 64. Flash memory array 64 stores application program 24, operating system 26, data, other application programs, and other operating systems. Operating system 26, application program 24, and other programs and data can be transferred to system RAM 52 from flash memory array 64 via bus 48.

File structure 58 includes flash memory array 64, RAM buffer 62, ROM BIOS extension software 44, and a portion of ROM BIOS software 43.

The file system driver software that defines the file structure for flash memory array 64 forms part of ROM BIOS software 43 and ROM BIOS extension software 44 in ROM 42. In the embodiment shown in FIG. 3, the file system driver is part of and integral to the firmware of personal computer system 40. BIOS 43 and BIOS extension 44 are memory blocks that are either direct-mapped or paged. Therefore, in the embodiment shown in FIG. 3, the file system driver software is neither stored in system RAM 52 nor stored in the flash memory array 64.

FIG. 4 illustrates a personal computer system 70 with yet another preferred file structure 94. Personal computer system 70 includes a central processing unit 12 and system RAM 72. In one preferred embodiment, system RAM 72 includes an application program 24 and an operating system 26. Personal computer system 70 also includes a bus 88 and a ROM 78. ROM 78 includes BIOS software 79 and BIOS extension software 80.

Personal computer system 70 also includes controller 92 and flash memory array 96. Flash memory array 96 is comprised of flash EEPROMs. Flash memory array 96 stores application program 24, operating system 26, data, other application programs, and other operating systems, which can be loaded into system RAM 72 via bus 88.

File structure 94 is comprised of controller 92, flash memory array 96, ROM BIOS extension 80, and a portion of ROM BIOS 79.

Personal computer system 70 shown in FIG. 4 has a fully hardware driven file structure for flash memory array 96. Controller 92 is specifically dedicated to defining and controlling the file structure for flash memory array 96. Controller 92 includes a microcontroller 100 for overseeing control.

Controller 92 also includes control logic 106. In one preferred embodiment of the present invention, control logic 106 comprises a programmable logic array ("PLA"). Logic circuitry 106 contains the digital logic that controls the operation of controller 92.

In one embodiment, controller 92 includes ROM 98 that stores file system driver software. The file system driver software is executable by microcontroller 100 and defines the file structure for flash memory array 96.

In an alternative embodiment, file system driver software that is executable and defines the file structure for flash memory array 96 forms part of ROM BIOS software 79 and BIOS ROM extension software 80.

Controller 92 includes buffer RAM 102. Buffer RAM 102 provides buffering for the transferring of files and for the creation and updating of directories.

Controller 92 also includes buffer/multiplexer 104. Buffer/multiplexer 104 provides buffering for the transferring of files. Buffer/multiplexer 104 also multiplexes data passed to and from flash memory array 96.

The logic associated with logic buffer/multiplexer circuit 104 can conform to any standard system bus interface. For example, the logic associated with buffer/multiplexer 104 can conform to one or more of the following standards: PC XT, PC AT (i.e., IDE—Industry Standard Architecture), EISA (i.e., Extended Industry Standard Architecture), MCA (i.e., MicroChannel Architecture), VME (i.e., Virtual Machine Environment), and Multibus.

In one embodiment of the invention, controller 92 is contained within personal computer system 70. For example, controller 92 could reside on a system board (not shown) within personal computer 70.

In an alternative embodiment, controller 92 can be an input/output ("I/O") device that resides external to personal computer system 70 or within an expansion slot (not shown) of personal computer system 70. For that alternative embodiment, the logic associated with buffer/multiplexer 104 can conform to any standard I/O interface. For example, buffer/multiplexer 104 can conform to one or more of the following I/O interfaces: IDE, ST506, SCSI (i.e., Small Computer System interface), and SA400 (i.e., a floppy disk standard). Thus, for that alternative embodiment, personal computer 70 would communicate with controller 92 by way of one of those standard I/O interfaces.

Personal computer system 40 of FIG. 3 and personal computer system 70 of FIG. 4 each include hardware that is dedicated to controlling the file structure of the respective flash memory array. For personal computer system 40, that additional hardware is RAM buffer 62. For personal computer system 70, that additional hardware is controller 92. RAM buffer 62 of FIG. 3 and controller 92 of FIG. 4 provide means for avoiding the necessity for storing file system control code in system RAM 52, flash memory array 64, system RAM 72, or flash memory array 96, respectively.

RAM buffer 62 and controller 92 each also serve to buffer data, so that system RAM 52 of FIG. 3 and system RAM 72 of FIG. 4 need not act as data buffers for file structures 58 and 94, respectively. Moreover, the inclusion of data buffer 62 in personal computer system 40 and controller 92 in personal computer system 70 means that system RAM 52 and system RAM 72 need not act as scratch pad areas for the file structures for flash memory arrays 64 and 96, respectively.

RAM buffer 62 of FIG. 3 and controller 92 of FIG. 4 allow file structure 58 and file structure 96 to each be recognized as containing a bootable storage area that is part of the basic system hardware for the respective personal computer system. The result is that RAM buffer 62 and controller 92 serve to improve the overall performance of the file structures of the flash memory arrays for the respective personal computer systems.

The different configurations of personal computers 10, 40, and 70 shown in FIGS. 2–4 result in different characteristics of the computers. In the computer system 10 of FIG. 2, file driver 28 is executed by central processing unit 12 as a foreground-task software routine that handles all the file management utilities for managing flash array 34. File system driver 28 takes up a portion of system RAM 22, but the size of system RAM 22 might be limited. For example, if operating system 26 of personal computer system 10 is MS-DOS, then system RAM 22 may be limited to one megabyte of "real mode" space.

For computer system 40 of FIG. 3, the file system driver software that defines the file structure for flash memory array 64 forms part of ROM BIOS software 43 and ROM BIOS extension software 44 in ROM 42. The amount of storage space in ROM 42 may be limited, however. For example, in certain MS-DOS compatible personal computers, all input-output functions are driven by firmware contained in a 64 kilobyte BIOS section of ROM with smaller BIOS ROM extensions of two kilobytes each. The file system driver software might exceed the space available in ROM 42 if ROM 42 is small in size.

In contrast, hardware controller 92 for computer system 70 stores the file driver, and this reduces the memory requirements with respect to flash array 96, ROM 78, and system RAM 72. Moreover, hardware controller 92 simplifies the file system control commands. For example, hardware controller 92 converts the file system control commands to high level procedure calls that are software accessible by a label referring to code residing in some other memory space. In one embodiment of the present invention, the simplified file system control commands or file driver control commands are stored in ROM 98 of hardware controller 92 as conventional BIOS-type control code. This in turn allows the solid-state file system 94 to be recognized as a basic bootable device. This results in simplified file system calls. Each file system call results in the execution of the file system driver (which is also referred to as the file system control code).

In one embodiment, each file system call for a computer system 70 of FIG. 4 is executed directly by CPU 12 fetching instructions from the main BIOS and direct-mapped BIOS extensions stored in ROM 78. In another embodiment, each file system call is executed by CPU 12 from memory pages residing at BIOS extension memory blocks stored in ROM 98. In yet another embodiment, each file system call is executed by microcontroller 100 from the file system driver stored in ROM 98 of hardware controller 92.

In a preferred embodiment, hardware controller 92 reduces each file related task to a single command from the host CPU 12, which helps to increase the off loading of the host CPU 12. Controller 92 accepts incoming data at RAM type memory speeds by holding the incoming data in local RAM buffer space 102. Hardware controller 92 completes each given task automatically, but only handles one operation at a time.

In addition, controller 92 allows host CPU 12 to interrupt any file system task for an immediate data access. This requires the additional RAM buffering of any valid file information that might otherwise reside in an inaccessible block. An inaccessible block is one involved with a write or an erase operation. The controller 92 resumes the original task following the interrupt. In one embodiment of the present invention, control hardware 92 cues up a given number of simultaneous write tasks.

Furthermore, in one embodiment, controller 92 continuously monitors the main flash memory storage array 96 for available free space and hot/cold block cycle imbalances. Hardware controller 92 also automatically initiates a redistribution operation with respect to flash memory 96 as needed. A redistribution operation evens out the cycling among blocks of flash memory array 96. The redistribution operation is automatically initiated by hardware controller 92 as needed in a fully background-task fashion.

Hardware controller 92 also automatically initiates a clean-up operation with respect to flash memory array 96 in order to free space for storage in flash memory 96. The clean-up operation is initiated by hardware controller 92 as needed and is done in a fully background-task fashion. The clean-up operation is described in more detail below.

In order for file system control hardware 92 to continuously monitor flash memory array 96 for available free space and hot/cold block cycle imbalances, and for controller 92 automatic initiate clean-up or redistribution operations, flash memory 96 should either (1) be resident as a storage device within personal computer system 70 or, alternatively, (2) be securely physically interlocked to personal computer system 70 if flash memory array 96 is removable. For the alternative embodiment wherein flash memory array 96 is removable, personal computer system 70 includes an indicator light-emitting diode ("LED") that is lit when a background task involving flash memory array 96 is occurring. The user of personal computer 70 is instructed not to remove flash memory array 96 when the LED is lit and, accordingly, when a background task is occurring.

In preferred embodiments, the interface circuitry to a main flash memory array can be either (1)input/output ("I/O") mapped, (2) paged memory mapped, or (3) direct memory mapped. FIG. 5 illustrates a I/O mapping scheme for the interface circuitry.

It is to be appreciated that for the embodiments shown in FIGS. 2–4, flash memory arrays 34, 64, and 96 could be used to replace either fixed disk drives or floppy disk drives.

The I/O mapping scheme shown in FIG. 5 uses an I/O plane 85 comprising serial transfer I/O ports that maps to flash memory array 81 and local buffer RAM 83. Because the I/O mapping scheme shown in FIG. 5 uses the separate I/O memory plane 85 instead of a main memory plane, (main memory is also referred to as system RAM), the I/O mapping scheme shown in FIG. 5 consumes none of the host computer's main memory space—that is, the I/O mapping scheme consumes none of the host computer's system RAM.

The I/O devices coupled to serial transfer I/O ports 85 cannot, however, support direct execution by a central processing unit given that those I/O devices (not shown) are serial rather than random access devices. Those I/O devices must download code files to system RAM for execution.

FIG. 6 illustrates a paged memory mapped interface to a paged map flash memory array 105. FIG. 6 shows main memory plane 89. Main memory plane 89 includes main system RAM 99, paging window 97, BIOS/ROM extension 95, BIOS 93, and expansion system RAM 91.

In one embodiment of the present invention, main memory plane 89 has a one megabyte address range constraint 101. The one megabyte address range constraint for main memory plane 89 means that the protected mode of a CPU or microprocessor is used to address portions of main memory plane 89 above the one megabyte address constraint 101. In other words, the protected mode of a CPU is used to address the expansion system RAM area 91 of main memory plane 89.

Typical early generation and low performance microprocessors did not include a protected mode. Moreover, typical early generation and low performance operating systems for personal computing systems did not have the capability for handling protected mode addressing. Therefore, those low performance microprocessors and operating systems could not address the areas above the one megabyte address. Nevertheless, certain high performance and later generation microprocessors and operating systems can address areas above the one megabyte address.

In FIG. 6, flash memory array 105 is comprised of small pages 107, 109, and 111 and flash memory array 105 is coupled to local buffer RAM 113. In an alternative embodiment of the present invention, flash memory array 105 could be comprised of any number of pages.

In FIG. 6, paging window 97 is the paged memory mapped interface that allows direct host central processing unit access to pages 107, 109, and 111 of flash memory array 105. Each page is changed to point to a different flash memory array 105 segment as needed.

FIG. 6 also shows paged firmware 103 that is used as an expansion for a device driver. Paged firmware 103 includes pages 115, 117, 119, and 121. In one embodiment of the present invention, paging window interface 97 is used to point to paged firmware 103. Having paging window 97 point to paged firmware 103 allows expansion to the larger firmware storage space 103. This gives the computer system additional storage space beyond a single (typically 2 kilobyte) BIOS/ROM extension location 95.

FIG. 7 illustrates a direct memory mapped interface to a main flash memory array. In FIG. 7, main memory plane 135 includes flash memory array map 149 and local buffer RAM 147 in addition to main system RAM 137, BIOS/ROM extension 139, BIOS 141, and expansion system RAM 145.

The main memory plane 135 shown in FIG. 7 has a one megabyte address range constraint 143. Flash memory array map 149 and local buffer RAM map 147 reside above the 1 megabyte address range constraint 143 of memory plane 135. This means that a protected mode of a CPU or microprocessor is used to address flash memory array map 149 and local buffer RAM map 147. In contrast, the CPU can address the main system RAM 137, the BIOS/ROM extension 139, and the BIOS 141 of main memory plane 135 without using the protected mode.

Flash memory array map 149 directly maps to the flash memory array of the personal computer system. Therefore, the flash memory array map 149 is equal in size to the flash memory storage array of the personal computer system.

Moreover, the local buffer RAM map 147 is directly mapped to the local buffer RAM of the personal computer system. It follows that the local buffer RAM map 147 is equal in size to the local buffer RAM of the personal computer system.

The direct memory mapped scheme thus employs a large amount of main memory space. In addition, the direct memory mapped method requires a CPU and operating system capable of addressing portions of the main memory plane above the 1 megabyte address range constraint 143.

The direct mapped scheme allows direct code execution from all of the flash memory array. On the other hand, the paged mapped scheme allows direct code execution from a portion of the flash memory array.

The direct mapped scheme requires a CPU and operating system capable of addressing beyond the one megabyte constraint. In contrast, the paged mapped scheme works with a CPU and operating system incapable of addressing beyond the one megabyte constraint.

FIGS. 8, 11, 12 and 14 through 16 show examples of preferred file structures for the flash memory EPROM array of a personal computer system. In particular, FIGS. 8, 11, 12, and 14 through 16 illustrate preferred file structures for flash arrays 34, 64, and 96 of personal computer systems 10, 40, and 70, respectively, of FIGS. 2 through 4. The file structures shown in FIGS. 8, 11, and 12 are variable file structures. The file structures shown in FIGS. 14 through 16 are sectored file structures. The file structures shown in FIGS. 8 and 14 each include a dynamic file directory, which resides within the flash memory array. The file structures shown in FIGS. 11, 12, 15 and 16 each include a file directory that is stored in a separate EEPROM or static RAM ("SRAM"). The file structures shown in FIGS. 8, 11, 14, and 15 include linked-list directory entries. The file structures shown in FIGS. 12 and 16 each include a file directory that is analogous to the directory used for prior hard or fixed disks. Variable files, sectored files, dynamic directories, separately-stored directories, linked list directories, and disk-analog directories are discussed in more detail below. The file structures shown in FIGS. 8, 11, 12 and 14 through 16 are each shown in state immediately following a clean-up operation.

FIG. 8 shows file structure 110 of flash memory array 112. File structure 110 is a variable-sized file structure. The variable sized file structure is also referred to as a variable file structure.

In a variable file structure such as file structure 110, code or data is stored contiguously so that a program counter of a CPU of a personal computer can step through the code or data. The variable file structure thus allows execution in place. Execution in place means that the CPU can execute code directly from a flash memory array without the need for RAM. Execution in place is also referred to as direct or in-place code execution.

The variable file structure of file structure 110 allows code files to be stored contiguously regardless of size for direct execution in place operation. Execution in place operation eliminates the time required to download to RAM-type memory for execution. The use of a variable file structure for flash memory thus reduces the RAM requirements for the personal computer system. This in turn reduces the system power draw of the extra RAM that would otherwise be required.

When file structure 110 is properly formatted, there are no hot or cold blocks, except for headers residing in the main array. This means that there is no need to keep track of the erase/programming cycling of adjacent blocks to prevent electrical data disturb conditions.

On the other hand, a variable file structure for a flash memory array is substantially different from the sector-based file structure found on a typical prior disk drive. Typical prior art operating systems for personal computers are designed to work with a disk sectored file structure only. Therefore, present typical high level operating system software would have to be modified or added to in order to work with a variable file structure.

In addition, for a variable file structure the file clean-up operation (described in more detail below) for the reallocation of file storage space is less efficient and more frequent than for a sectored file structure. Thus, with a variable file structure, the clean-up operations take up more background time. Moreover, a variable file structure requires more overall flash memory erase/write cycling.

Flash memory array 112 includes a number of data blocks for storing code or data. FIG. 8 illustrates an example of the file structure of flash memory array 112 in the state immediately following a clean-up operation.

Blocks 114, 116, and 118 in flash memory array 112 are "to-be-reserved" blocks, also referred to as reserve blocks or reserved blocks. Reserve blocks are blocks that provide temporary file back-up during a clean-up operation. A clean-up operation is used for reallocation. A clean-up operation involves first moving all currently active files out of blocks that will eventually be erased. Each flash memory block can be erased all at once. The reserved blocks 114, 116, and 118 thus are available for erase/reallocation during a clean-up operation. To-be-reserved blocks 114, 116, and 118 thus provide temporary file backup.

In one embodiment, at least one of the reserved blocks is used as a spare reserved block. This spare block helps to ensure that a reserved block is available for clean-up operations, which in turn helps to improve file system reliability.

As shown in FIG. 8, block 120 is a to-be-free block.

Blocks 122, 124, 126, and 128 are free blocks. Free data blocks 122, 124, 126, and 128 are usable blocks for storing code and data. Free blocks 122, 124, 126, and 128 of FIG. 8 are not active blocks, but instead are blocks that can be used for storing code or data.

During the operation of the personal computer system, data or code is placed in the free blocks. Data block 130 is a partially free block. A portion of block 130 contains active code or data. The rest of block 130 is partially free and available for future storage of code or data.

As free and partially free blocks are filled with code and data, the number of blocks that remain free of data or code diminishes. When the number of free, usable blocks reaches the allowed number of reserve blocks, a clean-up operation is initiated.

Blocks 132, 136, 138, 140, 142, and 144 together with a portion of block 130 comprise the active and deleted contiguous variable sized files. In one embodiment, blocks 132, 136, 138, 140, 142, and 144 together with a portion of block 130 also include the active and deleted subdirectories.

Files 150, 164, 166, 168, 170, 172, and 174 are the deleted files within blocks 132, 136, 138, 140, 142, and 144. The deleted files 150, 164, 166, 168, 170, 172, and 174 shown in FIG. 8 are files that had been deleted by the user.

During a clean-up operation, the oldest of the active files are rewritten into blocks 114 and 116. For the file structure 110 shown in FIG. 8, blocks 138, 140, 142, and 144 contain the oldest active and deleted contiguous variable files. The active files found in blocks 138, 140, 142, and 144 are the files to be rewritten into blocks 114 and 116. A compression operation occurs during the clean-up operation so that the four blocks 138, 140, 142, and 144 can fit into the two reserve blocks 114 and 116. During the compression operation, files previously deleted by the user are not rewritten into blocks 114 and 116. In FIG. 8, files 168, 170, 172, and 174 are the deleted files found in blocks 138, 140, 142, and 144. Those deleted files 168, 170, 172, and 174 are therefore not rewritten into blocks 114 and 116. Blocks 138, 140, 142, and 144 are said to reside in the next area to be compressed. The amount of compressible space is the amount of space taken up by the deleted files 168, 170, 172, and 174.

Blocks 114, 116, 118, and 120 are the blocks that resulted from a prior clean-up operation. Blocks 114, 116, 118, and 120 are therefore said to comprise the compressed space that resulted from the last clean-up operation.

The clean-up process for variable file structures, such as the file structure shown in FIG. 8, is circular in fashion. Reserve blocks are in consecutive order except when the reserve blocks loop around from the physical top of flash memory array 112 to the physical bottom of flash memory array 112. As stated above, when the number of free usable blocks reaches the allowed number of reserve blocks, the clean-up operation is initiated. The oldest blocks containing active and deleted files are compressed and cleaned-up first. The oldest blocks containing active and deleted contiguous variable files are found directly after the reserve blocks within flash memory 112. The number of blocks to be rewritten and compressed as part of a clean-up operation is determined by the number of deleted files within those blocks. In other words, the compressible space within the oldest blocks determines how many of those blocks will be rewritten as part of any one clean-up operation. For example, blocks 138, 140, 142, and 144 contain sufficiently large deleted files to allow the four blocks 138, 140, 142, and 144 to be compressed into the two blocks 114 and 116.

After blocks 138, 140, 142, and 144 are compressed into blocks 114 and 116 then blocks 138, 140, 142, and 144 are erased. After erasure of blocks 138, 140, 142, and 144, blocks 138, 140, and 142 become reserve blocks and block 144 becomes a free block.

File structure 110 shown in FIG. 8 includes a directory that stores the attributes and locations of the files within flash memory array 112. For file structure 110, all the directory information is stored within block 134 of flash memory array 112. The directory for file structure 110 is thus referred to as a flash memory based directory.

The directory of file structure 110 requires dynamic directory relocation. Dynamic directory relocation means that the file system moves the directory to various locations within flash memory array 112 by write and erase operations. For the example shown in FIG. 8, the directory occupies block 134 of flash memory array 112. Nevertheless, at various points in time, the directory could occupy any of the other blocks of flash memory array 112, including blocks 114, 116, 118, 120, 122, etc.

For the particular point in time shown in FIG. 8, the directory resides in block 134. Block 134 contains the directory flag 152, the boot record 154, the block status table 156 (which is also referred to as BST 156), the linked-list directory entries 158, and free directory space 160. Block 134 is referred to as the directory block.

Directory flag 152 stores a pattern of data that indicates which block stores the root directory for file structure 110. In one embodiment of the present invention, directory flag 152 stores a unique non-random data pattern that indicates that the block containing directory flag 152 is also the block containing the root directory. For example, in one embodiment, directory flag 152 stores a series of repeating AAh/55h data. In another embodiment, directory flag 152 stores some other non-random sequence of data.

In one embodiment of the present invention, a supplemental check is done to determine if a particular block is in fact the directory block. This is done to help avoid an error in locating the directory block that might otherwise occur if a block other than the directory block had a beginning pattern of data matching the pattern of data of directory flag 152. The supplemental check is done by checking a checksum data field residing in boot record 154 of directory block 134. In one embodiment, the checksum data field in boot record 154 is a particular pattern chosen because that pattern of data does not change if boot record 154 is both valid and current. In another embodiment, the checksum data field in boot record 154 is a dedicated cycle redundancy check ("CRC") or error correction code ("ECC") data field. First, the computer system would look for the directory flag. Then the computer system would check the checksum data field. A correct result from the checking of the checksum data field in boot record 154 would tell the computer system that it had in fact found the current valid directory block for flash memory array 112.

In one embodiment of the present invention, the logical one values of the checksum data field of boot record 154 would be overwritten to logical zero values when boot record 154 becomes no longer valid or no longer current.

Boot record 154 resides within block 134 next to directory flag 152. Boot record 154 contains information as to the particular file system type and the particular file system revision. Boot record 156 also contains certain file system parameters. Those parameters include formattable capacity information, reserved block information, appended directory information, information relating to the old directory, and information relating to the root directory.

The formattable capacity information is the size of the area of flash memory array 112 that can be formatted to store code and data. The reserved block information identifies which blocks are the reserved blocks. As discussed above, the reserved blocks are blocks used during clean-up and reallocation operations. The appended directory information is the location of any additional blocks that are being used for storage of additional directory information. An appended directory stored in one or more additional blocks would be necessary if the number of files stored within flash memory array 112 exceeds a certain amount. The old directory is a backup copy of the current directory. The parameter information relating to the old directory is the location within flash memory array 112 where that old directory is being stored. For example, in FIG. 8 the old directory is stored in block 114. The root directory is the first directory entry. The parameter information relating to the root directory is the location within flash memory array 112 of the root directory.

Block status table 156 contains information as to which blocks are active blocks, which blocks are reserve blocks, and which blocks are defective or failed blocks. In one embodiment, block status table 156 also contains cycle count information with respect to each block. The cycle count information indicates how many times a block has been erased and rewritten to. Block status table 156 resides within block 134 next to boot record 154.

Linked list directory entries 158 is also referred to as main directory 158. Main directory 158 resides within blocks 134 next to block status table 156.

Main directory 158 contains a series of individual directory entries. Each directory entry contains information as to directory entry type—namely, whether the directory entry (1) is for a file or (2) is a pointer to a subdirectory.

Each directory file entry includes information as to the file name/extension, the date, the time, the file type, the file length, the physical file address within flash memory array 112, a sibling pointer, and a child pointer.

In one embodiment of the present invention, the file name/extension are ten bytes that identify the file for the user. In that embodiment, the file name/extension can be words, numbers, and letters.

The date and time information within the file entry specify the date and time the file was either created or last revised or saved.

The file type information identifies whether the file comprises code, paged code, data, or data append segments.

The file length information identifies the physical size of the file or segment.

The physical file address information identifies the location within flash memory array 112 of the file or segment.

The sibling and child pointers comprise the linked-list directory hierarchy. In other words, the sibling and child pointers comprise the directory structural tree.

Each pointer points to the location of another directory entry. In one embodiment of the present invention, the pointer is an absolute physical address within flash memory array 112 of the directory entry pointed to. In other embodiment of the invention, however, each pointer consists of an offset address that represents an incremental address within the block or blocks that store the directory.

An example of a pointer that consists of an absolute physical address is 1264FFFF in hexadecimal. On the other hand, an example of a pointer that consists of an offset address is F0F in hexadecimal. The offset address of a pointer is also referred to as an index address.

The embodiment that uses the index approach for pointers minimizes pointer size. The index approach also avoids the necessity of recalculating each pointer address after the directory has been relocated after a clean-up operation.

If a single block of flash memory array 112 is insufficient to contain the entire directory, the root directory can point to a secondary appended directory block or to more than one secondary appended directory block. If one or more appended directory blocks are used, then each "index-style" pointer would include an index for determining which one of the directory blocks the directory entry pointer is referring to.

In one embodiment of the present invention, the pointer index address size is further minimized by requiring all directory entries to be of a common length, wherein the common length corresponds to an offset address increment referred to by the index.

The directory entries 158 form a linked-list. Starting with the root directory entry, the entire file system directory tree 158 is built from the link-list chaining of directory entries through the use of sibling and child pointers. An example of a linked-list directory tree is shown in FIGS. 9 and 10. In FIGS. 9 and 10 the directory entries are as follows: root directory entry 157, entry A 181, entry B 183, entry C 185, entry D 189, entry E 191, entry F 193, entry G 197, entry H 199, entry I 187, and entry J 195. The child pointers are pointers 159, 161, 165, 169, and 171. The sibling pointers are pointers 163, 167, 171,173, 175, and 179.

FIG. 9 shows the logical arrangement of linked-list directory entries. FIG. 10 shows the physical location of the linked-list directory entries within block 134 of flash memory array 112.

The sibling and child pointer fields of the last directory entry of any linked-list chain of directory entries contains the F (hexadecimal) null pattern of data, which is all logical ones. This indicates that this directory entry is the end of the chain. (An erased directory entry contains in its entirely— i.e., in all its fields—the F (hexadecimal) null pattern of data).

Directory entries are added to the linked-list chain each time a file is created, moved, or changed. The F (hexadecimal) null pattern of data in either the sibling or child pointer field of a last directory entry in a particular linked-list chain is overwritten to a new pattern of data that is either a respective sibling or child pointer to the newly-created directory entry. This overwriting can be done because each single bit cell of the flash memory array can be overwritten from a logical one to a logical zero. Thus, the linked-list chain of directory entries 158 grows and moves into free space 160 as files are created, moved, or changed. In other words, free directory space 160 provides room for the expansion with time of linked-list directory entries 158.

Each directory entry also has status bits to indicate the validity of its file or subdirectory entry. These status bits are overwritten to the zero state to indicate that the directory entry merely continues the directory linkage, but no longer represents an active file or subdirectory. When the status bits have been overwritten to the zero state to indicate a mere linkage, the directory entry is considered unused space within flash memory array 112. Furthermore, if the directory entry is a file type entry and the status bits are overwritten to the zero state to indicate that the entry merely continues the directory linkage, then the space within flash memory array 112 associated with this file type directory entry is considered unused space.

File system clean-up is required to free this unused space for subsequent writes. Because flash memory blocks erase all at once, each unused directory entry cannot be individually rewritten. Dynamic directory relocation helps to overcome this problem.

During clean-up, the unused directory entries are compressed out. New directory linked lists with unused directory entries compressed out must effectively start all over from the root directory entry. Dynamic directory relocation entails reconstructing the new linked list in a separate block. The prior directory block or blocks serves as a backup until a new directory tree is constructed. The new directory tree might consist of a new directory together with new append directory blocks. In one embodiment of the present invention, during the directory construction that is part of directory relocation, the new directory is written directly into a reserve block of flash memory array 112. For example, the new directory could be written into reserve block 116 of flash memory array 112.

Cleanup involves first moving all currently active files out of blocks that will be eventually erased, which is reallocation. The new directory reflects both the compression (i.e., removing) of old files and the physical relocation within flash memory array 112 of the still active files. In one embodiment of the present invention, these transferred files are written directly from old flash memory locations to new flash memory locations.

Block status table 156 is used to keep track of which blocks are free, in use, in reserve, or defective. Block status table 156 keeps track of the blocks throughout normal file read operations, throughout normal file write operations, and during clean-up operations.

In an alternative embodiment of the present invention, RAM buffering is used. With RAM buffering, during a clean-up operation files are written to RAM of the personal computer system as an intermediate step before the files are written to a new location within flash memory array 112. With RAM buffering, transferred files are not written directly from old to new locations within flash memory array 112. Instead, the files pass through RAM of the personal computer system.

In an alternative embodiment of the present invention, certain directory entries additionally include append pointers. An append pointer is used to split up an individual data file into two data files, one of the data files being in one block and other of the data files being in a different block. This allows data files to be split around block boundaries. This allows an individual data file to loop from the end to the beginning of physical addresses of flash memory array 112. This also allows an individual data file to jump around a defective or bad block.

In yet another embodiment of the present invention, each directory entry for files additionally includes secondary fields for a file name, a suffix, and an address. This permits one time renaming, editing, and appending files without the necessity of discarding the original directory entry. Suffix renaming could be used, for example, when back-up copies are kept when data files are edited.

In an alternative embodiment of the invention, file structure 110 shown in FIG. 8 additionally includes a header. The header resides, for example, in block 122, which no longer then is a free block.

The header is a file that contains information about the directories and about flash memory array 112. In one embodiment, the header contains information as to the unformatted size of the entire flash memory array 112, the formatted size of flash memory array 112, the total number of blocks within flash memory array 112, and detailed device information relating to flash memory array 112. In one embodiment of the present invention, the detailed device information stored in the header includes erase and write voltages; erase and write commands; and erase and write algorithms; individual and full chip maximum cycling specifications; and read, write, and erase performance characteristics of flash memory array 112.

In an alternative embodiment, the header additionally includes information as to the location of an alternate header or alternate headers.

With this alternative embodiment wherein the header is stored in one of the blocks of flash memory array 112, for example block 122, the header must be periodically refreshed. Periodic refreshing of the header entails completely erasing and rewriting the header periodically. This periodic refreshing of the header is necessary because the header typically is a cold block with respect to the other blocks of flash memory array 112. In other words, the header resides in a block that is cycled less frequently than the other blocks of flash memory array 112. Therefore, the header must be refreshed periodically.

In order to determine when the header needs to refreshed, the number of erase/program cycles of the blocks adjacent to the header and of the header are kept track of. A cycle count parameter is stored in the main header block. The cycle count represents the number of the erase/write cycles of the header and of the blocks adjacent to the header.

In this alternative embodiment, an alternative (i.e., backup) copy of the header is stored in another block of flash memory 112, for example, stored in block 124. This alternative header stored in block 124 is temporarily used as the header while the refresh operation is occurring.

In yet another alternative embodiment, the header does not reside within flash memory 112. Instead, the header resides within a memory array on a separate integrated circuit card that is part of a personal computer system. The memory array storing the header would be a "register-number accessed" memory array. The header would thus be stored in a separate shadow array.

With this shadow array embodiment, the header would not need to be refreshed because the header would not reside within flash memory array 112. It follows that the header would not be a cold block and that the header would not need to include a cycle count parameter relating to hot/cold cycling.

Returning to file structure 110 shown in FIG. 8, it is to be appreciated that use of a header is optional. One embodiment of the present invention avoids the use of a header with the following structure. Flash memory 112 has manufacturer and device identification codes stored within the memory array. In one embodiment of the present invention, those manufacturer and device identification codes trigger the software of the personal computer system to go to a look-up table that stores header type information that can be inferred from those particular manufacturer and device identification codes.

FIG. 11 shows file structure 210 of flash memory array 212. File structure 210 is a variable sized file structure, which is also referred to as a variable file structure.

Blocks 214, 216, and 218 of flash memory array 112 are "to-be-reserved" blocks which are also referred to as reserve or reserved blocks. Block 220 is a to-be-free block.

Block 222, 224, 226, and 228 are free blocks. Block 230 is a partially free block, which partially contains data or code and is partially free.

Blocks 232, 233, 236, 238, 240, 242, and 244 together with a portion of block 230 comprise the active and deleted contiguous variable sized files. In one embodiment, blocks 232, 233, 236, 238, 240, 242, and 244 together with a portion of block 230 also include the active and deleted subdirectories. Files 250, 264, 266, 268, 270, 272, and 274 are deleted files within blocks 232, 236, 238, 240, 242, and 244.

For the file structure 210 shown in FIG. 11, boot record 254, block status table 256, linked-list directory entries 258, and free directory entries 260 are stored in a separate memory 234 that is not part of flash memory array 212. That separate memory 234 is, however, included as part of the personal computer system that also includes flash memory array 212.

In one embodiment of the invention, separate memory 234 is conventional byte-alterable electrically erasable programmable read only memory ("EEPROM").

In another embodiment of the present invention, separate memory 234 is static RAM ("SRAM"). That SRAM 234 is coupled to a battery that is part of the personal computer system. When external power to the personal computer system is removed, the battery that is coupled to SRAM 234 continues to supply power to SRAM 234. The power applied to SRAM 234 by the battery allows SRAM 234 to retain data and code even while power is removed from the personal computer system. The battery is required because otherwise an SRAM loses all code and data once power is removed from SRAM.

In yet another embodiment of the present invention, memory 234 consists of an NVRAM.

In the embodiment shown in FIG. 11, memory 234 is EEPROM. No directory flag needs to be stored in EEPROM 234 given that by definition the link-list directory entries 258 are found in memory 234. In other words, the current directory is stored in memory 234.

In one embodiment of the present invention, file structure 210 includes a header stored within flash memory array 212. The header includes information similar to the information contained in the header discussed with respect to FIG. 8. With respect to file structure 210 of FIG. 11, the header additionally includes information that states that the root directory resides at a fixed location within location 258 of memory 234. In other words, the header defines the root directory as residing in a fixed physical address space within memory 234. Again, no directory flag is needed.

As discussed above, flash memory array 212 can only be erased in blocks and not on an individual byte basis. In contrast, EEPROM 234 is electrically erasable and user rewritable on a byte-by-byte basis. EEPROM 234 is thus said to be byte alterable. The fact that EEPROM 234 is byte alterable means that file names, suffixes, addresses, and pointers within linked-listed directory entries 258 can be individually erased, rewritten, and changed. Deleted files can be skipped over by making direct individual changes to preceding sibling pointers and child pointers.

In the embodiment of file structure 210 shown in FIG. 11, each directory entry within linked-list directory entries 258 is defined to be nearly identical in size to each of the other directory entries within linked-list directory entries 258. Deleted directory entries can then be reused as needed in a random fashion.

The linked-listed directory entries 258 of FIG. 11 are otherwise similar to the linked-list directory entries 158 of FIG. 8. The linked-listed directory entries 258 support index type pointers described above with reference to linked-list directory entries 158.

Boot record 254 of FIG. 11 is similar to boot record 154 of FIG. 8. Boot record 254 of FIG. 11 contains information as to the particular file system type and the particular file system revision. Boot record 254 also contains certain file system parameters, including formattable capacity of flash memory array 212, reserved block information with respect to flash memory array 212, and information relating to the location of the root directory within linked-list directory entries 258.

Block status table 256 of FIG. 11 is similar in content to block status table 156 of FIG. 8. Block status table 256 of FIG. 11 contains information as to which blocks of flash memory array 212 are active blocks, which blocks are reserve blocks, and which blocks are defective or failed blocks.

The clean-up operation with respect to flash memory array 212 of FIG. 11 is similar to the clean-up operation with respect to flash memory array 112 of FIG. 8. The clean-up of flash memory array 212 of FIG. 11 operates in conjunction with block status table 256 and is done in a circular fashion as described above with respect to flash memory array 112 of FIG. 8. For file structure 210 shown in FIG. 11, blocks 238, 240, 242, and 244 are the next blocks to be cleaned up and compressed.

Free directory space 260 of FIG. 11 is space within which future linked-listed directory entries can be expanded into. It is to be appreciated that the directory entries 258 are (1) byte alterable if memory 234 is byte-alterable EEPROM or (2) bit alterable if memory 234 is RAM.

FIG. 12 shows file structure 300 of flash memory array 302. File structure 300 includes byte alterable directory entries 366 that are analogous to hard disk directory entries and floppy disk directory entries. The byte alterable directory entries 366 are stored in a separate memory 360.

File structure 300 is a variable sized file structure, also referred to as a variable file structure.

Blocks 322, 324, and 326 of flash memory array 302 are "to-be-reserved" blocks, which are also referred to as reserved blocks or reserve blocks. Block 328 is a to-be-free block.

Blocks 330, 304, 306, and 308 are free blocks. Block 310 is a partially free block, which partially contains data or code.

Blocks 312, 314, 316, 318, and 320, together with a portion of block 310, comprise (1) the active and deleted contiguous variable sized files and (2) the fixed length active and deleted subdirectory files. The files 340, 342, 344, 346, 350, and 354 are deleted files within blocks 312, 314, 316, 318, and 320. Files 338, 348, and 352 are deleted subdirectory files within blocks 316, 318, and 320.

For file structure 310 shown in FIG. 12, boot record 362, block status table 364, and directory entries 366 are stored in a separate memory 360 that is not part of flash memory array 302. That separate memory 360 is, however, included as part of the personal computer system that also includes flash memory array 302.

In one embodiment of the present invention, separate memory 360 is conventional byte alterable EEPROM.

In another embodiment, separate memory 360 is SRAM. That SRAM 360 is coupled to a battery that is part of the personal computer system. When external power to the personal computer system is removed, the battery that is coupled to SRAM 360 continues to supply power to SRAM 360.

In yet another embodiment of the present invention, memory 360 consists of an NVRAM (i.e., a non-volatile RAM).

In the embodiment shown in FIG. 12, memory 360 is a byte-alterable EEPROM. No directory flag needs to be stored in EEPROM 360 given that by definition the directory entries 366 are found memory 360. The current root directories are stored in memory 360.

In one embodiment, file structure 300 includes a header stored within flash memory array 302. The header is similar to the header discussed with respect to FIG. 8. The header for file structure 300 of FIG. 12 also includes information that states that the root directory resides at a fixed location within location 366 of memory 360. Again, no directory flag is needed.

Flash memory array 302 can only be erased in blocks and not on an individual byte basis. In contrast, EEPROM 360 is electrically erasable and user rewritable on a byte-by-byte basis. EEPROM 360 is thus said to be byte alterable. The fact that EEPROM 360 is byte alterable means that the directory entries 366 can be individually erased, rewritten, and changed.

The directory structure 366 of file structure 300 is analogous to the directory structure of a hard disk or a diskette in a personal computer system. The directory structure 366 is referred to as a disk analog directory structure.

The disk analog directory structure 366 results in an operating system interface for the personal computer system that is quasi-compatible with magnetic hard disk based file structures. For file structure 300, data files are created in the main flash memory array 302 to store both directory and subdirectory contents. Similarly, on prior magnetic hard disk drives and floppy disk drives for personal computer systems, both directory and subdirectory contents are stored on the disks. In addition, directory entries 366 include structure similar to a file allocation table ("FAT") found within the DOS operating system stored on many prior hard disk drives.

For the embodiment shown in FIG. 12, the directory entries 366 are stored at locations 368, 370, 372, 374, and 376 of memory 360. As described in more detail below, the disk analog directory entries 366 differ from the linked-listed directory entries 158 and 258 of FIGS. 8 and 11 respectively.

FIG. 13 illustrates examples of the structures of the directory entries 366. FIG. 13 illustrates directory entries 301 and 361 that are part of directory entries 366. Each directory entry is a fixed length—for example, 40 bytes.

Root directory entry 301 includes an eight-byte name 311, a three-byte file extension 313, a one-byte attribute flag 315, a ten-byte reserved area 317, a two-byte time area 319, a two-byte date 321, a two-byte starting cluster 323, a one-byte status of cluster flag 325, a four-byte file size area 327, and a two-byte pointer 329.

The file name and extension bytes 311 and 313 identify the file corresponding to root directory 301.

Attribute flags 315 are comprised of eight-bits 341, 343, 345, 347, 349, 351, 353, and 355. Bit 341 (bit 0) marks the files as a read only file, which means that the file cannot be edited or erased. Bit 343 (bit 1) indicates that the file is hidden to DOS and cannot be read with the directory command of DOS and certain other DOS commands. Bit 345 (bit 2) is the system bit that indicates that the file is a DOS file that cannot be read with a directory command and certain other DOS commands.

Bit 347 (bit 3) is a volume label. Bit 349 (bit 4) is a subdirectory pointer. If either bit 347 or 349 is set, then DOS must handle the entry differently from a normal file directory entry.

If the subdirectory bit 349 is set, this indicates that the directory entry is a subdirectory file and that the subdirectory file is stored within one of the blocks of flash memory array 302.

Bit 351 (bit 5) is an archive bit that indicates if the file has been backed up by a backup utility. Bit 353 (bit 6) and bit 355 (bit 7) are reserved bits that are not used.

Reserved bytes 317 are reserved and not used.

Bytes 319 and 321 are the time and date stamps for the files.

Bytes 327 indicate the file size or length.

Bytes 323 and 325 of root directory 301 are the file allocation table ("FAT") type bits of root directory 301. Starting cluster bytes 323 are the file's starting address within flash memory array 302. Byte 325 is referred to as the status of cluster byte. The status of cluster byte 325 indicates the status of the file that starts at the starting address indicated in bytes 323. Status byte 325 indicates whether the file is available, deleted, or defective.

It is to be appreciated that the starting cluster referred to by bytes 323 is a simulated artificial cluster. The file referred to by file directory entry 301 is in fact a variable length file. The cluster file structure is simulated by root directory 301 in order to have a directory structure that is somewhat analogous to the directory structure found on a hard magnetic disk drive (fixed or floppy) upon which DOS is stored.

If the file size stored within file size bytes 327 is greater than the size of starting cluster 323, then a plurality of simulated clusters must be chained together in order to completely specify the file. This is done as follows. The pointer bytes 329 of root directory 301 point to append directory entry 361 of FIG. 13. Append directory entry 361 includes file allocation table bytes 383 and 385. Bytes 383 are the cluster bytes. Byte 385 is the status of cluster byte.

Cluster bytes 383 store the starting address within flash memory array 302 of the data or code that is to be chained with the data or code pointed to by the address stored in starting cluster bytes 323. Byte 385 of append directory 361 indicates the status of the file starting at the address stored with bytes 383. The status of cluster byte 385 indicates whether the file that is stored at the address stored in bytes 383 is available, deleted, or defective.

If no other data or code is to be chained together to form the file, then pointer 389 of directory entry 361 does not point to any other directory entries.

Because the directory entry 361 is merely an append directory entry, it does not matter what the contents are of name bytes 371, extension bytes 373, attribute byte 375, reserved bytes 377, time bytes 379, date bytes 381, and file size bytes 387.

It is to be appreciated that certain directory entries do not have any append files. In addition, certain other directory entries have a plurality of append files. The pointer of an append file can point to another file.

File structure 300 takes advantage of the byte alterability of memory 360 by using uniform length directory entries to make them easily reusable by way of overwriting. The symmetrical entry sizes also allow the entries to be treated as disk conventional file allocation table entries. By using FAT-style status of cluster bytes, status reporting for file structure 300 is relatively simple, and resembles the status reporting for conventional hard disk drives storing DOS.

Parent directory entries of memory 360 refer to combination directory/FAT index locations as a hard (or floppy) disk uses its separate FAT indices for file references.

Each directory/FAT entry within memory 360 mimics DOS entries by referring to a file's starting address as the starting cluster. Artificial clusters are chained to this first FAT entry whenever the file length is larger than the simulated cluster.

Boot record 362 stored in memory 360 stores the simulated cluster size. Boot record 362 also stores the number of available clusters and the maximum number of directory entries. The number of available clusters is the formattable capacity of flash memory array 302. Boot record 362 also contains information as to the particular file system type and the particular file system revision. Boot record 362 also contains certain other file system parameters, including reserved block information with respect to flash memory array 302, and information relating to the location of the root directory within directory entries 366.

The operating system of the personal computer system sees a number of sectors equivalent to the number of directory/FAT entries within memory 360 multiplied by the simulated cluster size that is defined on format. The number of directory/FAT entries within memory 360 is equal to the size of the combined area 368, 370, 372, 374, and 376 divided by the size of the directory entries.

Block status table 364 of FIG. 12 is similar in contents to block status table 156 of FIG. 8. Block status table 364 of FIG. 12 contains information as to which blocks of flash memory array are active blocks, which blocks are reserved blocks, and which blocks are defective or failed blocks.

The clean-up operation with respect to flash memory array 302 of FIG. 12 is similar to the clean-up operation with respect to flash memory array 112 of FIG. 8. The clean-up of flash memory array 302 of FIG. 12 operates in conjunction with block status table 364 and is done in a circular fashion as described above with respect to flash memory array 112 of FIG. 8. For file structure 300 shown in FIG. 12, blocks 316, 318, and 320 are the next blocks to be clean-up and compressed.

The personal computer system must track the directory and main flash memory 302 utilization to know where the next available space is for each new entry. This is an actively calculated process given the lack of disk-like sectors.

The size of the directory entries 366, the boot record 362, and the block status table 364 cannot expand beyond the size of memory 360. Nevertheless, subdirectory files can be stored within flash memory array 302.

Due to the inability to generally overwrite flash memory information, the directory files 366 must preallocate space for a fixed number of entries, and then point to an append for additional entries.

FIG. 14 shows file structure 400 of flash memory array 401. File structure 400 is a file structure that includes sectors and a dynamic flash directory. File structure 400 is also referred to as a sectored file structure.

In a sectored file structure such as file structure 400, code or data is stored in sectors. The sectors are analogous to sectors on prior art hard disks and diskettes of a personal computer system. On a prior art hard disk, there are typically 17 sectors per track. For some hard disks, there are four sectors per cluster. For some other other hard disks and for a high density 3.5 inch diskette, a cluster comprises a single sector. A cluster is a smallest logically addressable stored unit.

For file structure 400, a cluster is made up of a single sector. Each sector is 512 bytes wide, which is a fixed length. Each cluster is also referred to as an allocation unit ("AU").

In an alternative embodiment of the present invention, each cluster is made up of two sectors. In yet another alternative embodiment, each cluster is made up of three or more sectors.

The sectored file structure of file structure 400 helps to simplify software or firmware driver based emulation of conventional disk file structures. This is because the sectored file structure of file structure 400 is similar to the sectored file structure found on hard disk drives.

Sectored file structure of file structure 400 also allows random selection of erase blocks for clean-up. This in turn helps to reduce file movement when such file movement is unnecessary. This also helps to reduce excess cycling.

On the other hand, a sectored file structure cannot support complete contiguous execution in place of code files. Nevertheless, contiguous sector-paged memory file schemes allow large contiguous portions or smaller code files to execute in place.

For a sectored file structure, the cycling of individual blocks must be tracked to support the active management of hot/cold erase block redistribution during clean-up. This cycling of individual blocks is intrinsically managed by the clean-up/reallocation rules discussed below.

Blocks 416, 424, and 428 of flash memory array 401 "to-be-reserved" blocks, which are also referred to as reserve blocks or reserved blocks. Block 408 is a to-be-free block, which becomes a free block after the next clean-up operation.

Blocks 404, 414, and 420 of flash memory array 401 are free blocks, which are usable blocks for storing code and data. Block 430 is a partially free block, which contains data or code at location 464 and which has free space at allocation 462.

The sectors within blocks 402, 406, 412, 418, and 426, together with the sectors within portion 464 of block 430, comprise the active and deleted files and subdirectories. Sectors 403, 405, 409, 411, 413, 415, 417, 423, 425, and 427 within block 402 and sectors 431, 433, 439, 443, 445, and 453 within block 406 are examples of active file and subdirectory sectors. Blocks 412, 418, 426, and 430 also include active file and subdirectory sectors. Sectors 407, 419, 421, 429, 435, 437, 441, 447, 449, 451, 457, 459, 461, 463, 465, 467, 469, 471, 473, 475, 477, 479, 481, 483, 485, 487, 489, and 491 are the sectors containing deleted files and subdirectories.

Through the use of file allocation table 446, the clusters of file structure 400 are logically concatenated in order to form a complete file. This is similar to what is done in a prior conventional personal computer system with a fixed disk drive or a floppy disk drive, wherein the clusters of the fixed disks or floppy disk are logically concatenated to form a complete file.

In FIG. 14, file allocation table 446, is stored within block 422. File allocation table 446 is part of the dynamic directory scheme used by file structure 400. Block 422 includes directory flag 440, boot record 442, block status table 444, FAT 446, linked-list directory entries 448, and free space 450. Block 422 thus contains the current directory.

Directory flag 440 stores a pattern of data that indicates that block 422 contains the linked-list directory entries 448.

Boot record 442 follows directory flag 440. Boot record 442 contains information as to the particular file system type and the particular file system revision. Boot record 442 also contains certain file system parameters. Those parameters include formattable capacity information, reserved block information, appended directory information, information relating to the old directory, and information relating to the root directory.

Block status table 444 follows boot record 442. Block status table 444 contains information as to which blocks are active blocks, which blocks are reserve blocks, and which blocks are defective or failed blocks. Block status table 444 also contains cycle count information for each block. The cycle count information indicates how many times a block has been erased and rewritten to.

File allocation table 446 follows block status table 444 in block 422. File allocation table 446 resides before the root directory found within linked-list directory entries 448.

Linked-list directory entries 448 are also referred to as main directory 448. Main directory 448 contains a series of individual directory entries. Each directory entry is either (1) a pointer to a subdirectory (the subdirectory being stored in a block other than block 422) or (2) a directory for a file. The directory entries 448 of FIG. 14 resemble the directory entries 158 of FIG. 8 except that FAT pointers 446 are used in file structure 400 in place of physical main-memory starting addresses. Each directory file entry of FIG. 14 includes information as to the file name/extension, the date, the time, the file type, the file length, a sibling pointer, and a child pointer. Each directory file entry also includes a cluster number that is the number of the first cluster used in a particular file. The cluster number is two bytes in size. In one embodiment, file allocation table 446 is a list of two byte entries, one for each cluster. The operating system for file structure 400 uses the first cluster number to access file allocation table 446. The FAT entry for that cluster contains the cluster number of the next cluster in the file. Each FAT 446 entry is a pointer to the next cluster of the file. The operating system uses this to access the next cluster of the file and then continues until a special marker in the FAT 446 is reached. In one embodiment of the present invention, that special marker is F null in hexadecimal. If the FAT 446 entry is zero, this indicates that the cluster is not in use.

For file structure 400 of FIG. 14, each FAT entry of FAT 446 has a one-to-one correspondence to a physical cluster of flash memory array 401 and points to chained FAT entries until the last file allocation cluster is reached. The last FAT entry is indicated by F (hexadecimal) null data, which is data that is still erased—i.e., all ones.

The directory entries for file structure 460 of FIG. 14 resemble the directory entries for file structure 110 of FIG. 8 except that for file structure 400 of FIG. 14 FAT pointers are used in place of physical main memory starting addresses. For file structure 400 of FIG. 14, non-contiguous file information is concatenated by disk-like FAT chaining.

One of the ways in which file structure 400 differs from that of a fixed disk or a floppy disk is that child and sibling pointers are used within linked-list directory entries 448.

The FAT entries and the main-memory clusters themselves are symmetrical in length, and both consist of shortened index-type addresses. The maximum number of FAT entries is fixed, determining the formattable capacity for a given cluster size (i.e., number of sectors per AU) and the number of reserve blocks. This is recorded in boot record 442 upon formatting.

In addition to "free," "reserve", and "bad" status, block status table 444 contains cycle count information on each block. Block status table 444 reserves the directory block(s) and reserve blocks as inaccessible (to allow subsequent clean-up), preventing the file system from attempting to overwrite these blocks. Failed blocks are also avoided and are indicated in block status table 444.

Clusters are generally written contiguously through the end a given free block, then concatenated to subsequent clusters written into another free block. This normally-consecutive cluster usage can support paged execute-in-place operation for appropriately-specified code files. Subsequent file deletion creates random unused portions throughout the main flash memory array.

When clean-up is required, the personal computer system identifies which blocks are to be cleared for a subsequent rewrite. In other words, upon clean-up the computer system identifies the blocks having files that are to be reallocated and moved upon clean-up. The identification of blocks to be cleared upon clean-up is governed by two rules. The first rule is that the least cycled block is selected. This reduces the cycling imbalances between hot and cold blocks.

If there are not large disparities between cycle counts of blocks, then the second rule governs. In other words, where cycling distribution is not flagged as a problem by the computer system, the second rule governs. The second rule states that the blocks with the highest number of deleted sectors are the blocks that are selected to be cleared.

The reason for this second rule is that the clusters containing deleted files do not need to be moved out of a block prior to erasure. The deleted files contain no information that must be saved, the deleted files can be erased as part of a clean-up operation. In other words, there needs to be no reallocation of deleted files. The second rule thus results in a minimal amount of moving out of active sectors or clusters prior to the erasure that is part of a clean-up operation.

It is essentially a random process that governs which blocks contain the most deleted file clusters. Therefore, the second rule means that the clean-up scheme results in a largely random block selection with respect to the blocks to be cleared. This essentially random block selection helps to increase the clean-up efficiency while, at the same time, minimize overall cycling disparities.

The above rules one and two together manage the cycling distributions within flash memory array 401. Rules one and two together help to minimize cycling differentials. It follows that the clean-up of file structure 400 is essentially random.

For file structure 400 of FIG. 14, a new directory (and new append directory), along with a new FAT, are constructed in a reserve block upon clean-up.

In one embodiment, file structure 400 includes a header stored within flash memory array 401. The header includes information similar to the information contained in the header discussed with respect to file structure 110 of FIG. 8.

FIG. 15 shows file structure 500 of flash memory array 501. File structure 500 is a file structure that includes sectors, and is referred to as a sectored file structure.

In sectored file structure 500, data or code is stored in sectors. In the embodiment of FIG. 15, there is one sector per cluster, and each sector is 512 bytes.

Blocks 508, 516, and 524 are the reserve blocks of file structure 500. Block 508 is a to-be-free block.

Blocks 504, 514, and 520 are free blocks. Block 530 is a partially free block, which contains data or code at location 564 and which has free space at location 562.

The sectors within blocks 502, 506, 512, 518, and 526, together with the sectors within portion 564 of block 530, comprise the active and deleted files and subdirectories. Sectors 503, 505, 509, 511, 513, 515, 517, 523, 525, and 527 within block 502 and sectors 531, 533, 539, 543, 545, and 553 within block 506 are examples of active file and subdirectory sectors. Blocks 512, 518, 526, and 530 also include active file and subdirectory sectors. Sectors 507, 519, 521, 529, 535, 537, 541, 547, 549, 551, 557, 559, 561, 563, 565, 567, 569, 571, 573, 575, 577, 579, 581, 583, 585, 587, 589, and 591 are the sectors containing deleted files and subdirectories.

For file structure 500 shown in FIG. 15, boot record 542, block status table 544, file allocation table 546, linked-list directory entries 548, and free directory space 550 are stored in a separate memory 534. That is not part of flash memory array 501. The separate memory 534 is, however, included as part of the personal computer system that also includes flash memory array 501.

In one embodiment of the invention, separate memory 534 is conventional byte-alterable EEPROM.

In another embodiment, separate memory 534 is an SRAM coupled to a battery as a back-up.

In yet another embodiment, separate memory 534 is an NVRAM.

In the embodiment shown in FIG. 15, memory 534 is an EEPROM. No directory flag needs to be stored in EEPROM 534 given that by definition the linked-list directory entries 548 are found in memory 534. In other words, the current directory is stored in memory 534.

In one embodiment, file structure 500 includes a header stored within flash memory array 501. The header stores information similar to the information contained in the header discussed with respect to FIG. 8.

File structure 500 of FIG. 15 resembles file structure 400 of FIG. 14, except that file structure 500 has directory entires 548 at a fixed location in separate memory 534. This means that file structure 500 has no directory flag with respect to memory 534 and that there are a maximum number of directory entries.

To simplify random link-list directory modification, directory entries are again symmetrical in length. The block status table 544 is used for cycling management during random, relatively efficient block reallocation. All other directory/FAT operations resemble those of file structure 400 of FIG. 14.

FIG. 16 shows file structure 600 of flash memory array 601. File structure 600 is a file structure that includes sectors, and is referred to as a sectored file structure.

In sectored file structure 600, data or code is stored in sectors. In the embodiment of FIG. 16, there is one sector per cluster, and each sector is 512 bytes.

Blocks 608, 616, and 624 are the reserve blocks of file structure 600. Block 608 is a to-be-free block.

Blocks 604, 614, and 620 are free blocks. Block 630 is a partially free block, which contains data or code at location 664 and which has free space at location 662.

The sectors within blocks 602, 606, 612, 618, and 626, together with the sectors within portion 664 of block 630, comprise the active and deleted files and subdirectories. Sectors 603, 605, 609, 611, 613, 615, 617, 623, 625, and 627 within block 602 and sectors 631, 633, 639, 643, 645, and 653 within block 606 are examples of active file and subdirectory sectors. Blocks 612, 618, 626, and 630 also include active file and subdirectory sectors. Sectors 607, 619, 621, 629, 635, 637, 641, 647, 649, 651, 657, 659, 661, 663, 665, 667, 669, 671, 673, 675, 677, 679, 681, 683, 685, 687, 689, and 691 are the sectors containing deleted files and subdirectories.

For file structure 600 shown in FIG. 16, boot record 642, block status table 644, file allocation table 646, and directory entries 648 are stored in a separate memory 634 that is not part of flash memory array 601. The separate memory 634 is, however, included as part of the personal computer system that also includes flash memory array 601.

In one embodiment of the invention, separate memory 634 is conventional byte-alterable EEPROM.

In another embodiment, separate memory 634 is an SRAM coupled to a battery as a back-up.

In yet another embodiment, separate memory 634 is an NVRAM.

In the embodiment shown in FIG. 16, memory 634 is an EEPROM. No directory flag needs to be stored in EEPROM 634 given that by definition the directory entries 648 are found in memory 634. In other words, the current directory is stored in memory 634.

In one embodiment, file structure 600 includes a header stored within flash memory array 601. The header stores information similar to the information contained in the header discussed with respect to FIG. 8.

File structure 600 of FIG. 16 resembles file structure 400 of FIG. 14, except that file structure 600 (1) has a directory structure 648 that is analogous to the directory structure of a hard disk or a diskette in a personal computer system and (2) stores directory entries 648 in a separate memory 634. File structure 600 has no directory flag with respect to memory 634.

File structure 600 of FIG. 16 thus has a disk-analog directory structure. This implementation simply follows magnetic disk directory and FAT conventions. Byte alterability allows direct overwriting the directory and FAT's sector use/chaining information. The primary flash-specific aspect is that the logical sectors can be overwritten only after first erasing at the erase block-level. Thus the subdirectory file entry schemes and most other constraints and characteristics resemble file structure 300 of FIG. 12 although clean-up follows the conventions of file structure 110 of FIG. 8. File structure 600 of FIG. 16 operates in a manner analogous to conventional magnetic disk operation, with reading and writing file and subdirectory clusters that are similar to disk clusters. The use of block status table 644 and the clean-up operations are the key flash-specific elements. In a preferred embodiment, "backup directory/FAT" approach typical of conventional disks is employed.

The preferred embodiments of the present invention help to improve device reliability due to intrinsic flash cycling management. The preferred embodiments of the present invention also help to improve file system reliability due to intrinsic backup copy provisions—i.e., avoiding overwriting of active file and/or directory information.

The preferred embodiments of the present invention minimize system RAM requirements by (1) embedding control code in firmware, and (2) using reserve blocks for direct block-to-block file and directory transfer during clean-up.

Preferred embodiments of the present invention minimize waste of flash memory space through the use of linked-list directory structures.

Variable-file embodiments of the present invention allow for reallocation via clean-up of small, manageable portions of the flash array.

In the embodiment employing a sectored/dynamic directory, the block status table helps to improve performance, reliability, and efficiency. The block status table supports (1) uniform flash device and block cycling to maximize device reliability while helping to prevent hot spots from causing erase and write performance degradation relative to other devices and blocks within devices (when they exist) and (2) the tracking of reserve blocks for fast, reliable clean-up and "background-task" erasure.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A processor-controlled method of file management for a nonvolatile semiconductor memory with a plurality of physical erase blocks, wherein bits of the memory cannot be overwritten from a first logical state to a second logical state without a prior erasure, wherein erasure is by physical erase block and not on an individual byte basis, the method comprising the steps of:

(1) allocating a first portion of the memory in a first physical erase block for storing an active file and a deleted file;

(2) allocating a second portion of the memory in a second physical erase block for storing a copy of the active file;

(3) storing in an allocated third portion of the memory information as to whether a portion of the memory has been allocated to store the active and deleted files or allocated to store the copy of the active file;

(4) reclaiming memory space by storing in the second portion of the memory the copy of the active file and by erasing the first physical erase block including the first portion of the memory in order to permit reuse of the first portion of the memory for storage;

(5) storing data in the first and second portions of the memory in a inked-list variable file structure.

2. The processor-controlled method of claim 1, further comprising the steps of:

(7) reallocating the second portion of the memory for storing the active file and the deleted file;

(8) reallocating the first portion of the memory for storing the copy of the active file.

3. The processor-controlled method of claim 1, further comprising the step of storing in an allocated fourth portion of the memory an indication as to whether a portion of the memory is in use or not in use.

4. The processor-controlled method of claim 1, further comprising the step of storing in an allocated fourth portion of the memory an indication as to whether a portion of the memory is defective or not defective.

5. The processor-controlled method of claim 1, wherein the first and second portions of the memory are allocated to have a variable-length file structure.

6. The processor-controlled method of claim 5, further comprising the step of storing in an allocated fourth portion of the memory information concerning the file structure of the memory.

7. The processor-controlled method of claim 6, wherein the information concerning the file structure comprises a file structure type.

8. The processor-controlled method of claim 6, wherein the information concerning the file structure comprises a file name.

9. The processor-controlled method of claim 6, wherein the information concerning the file structure comprises information concerning whether a file is active or deleted.

10. The processor-controlled method of claim 1, wherein the active file comprises a linked list.

11. A processor-controlled method of file management for a nonvolatile semiconductor memory with a plurality of physical erase blocks, wherein bits of the memory cannot be overwritten from a first logical state to a second logical state without a prior erasure, wherein erasure is by physical erase block and not on an individual byte basis, the method comprising the steps of:

(1) reclaiming memory space by copying active files and not deleted files from a first portion of a first physical erase block of the memory to a second portion of a second physical erase block of the memory and then erasing the first physical erase block including the first portion;

(2) storing in a third portion of the memory information as to whether a portion of the memory is free for further data storage or in use;

(3) storing data in memory free space in a sectored file structure.

12. The processor-controlled method of claim 11, further comprising the steps of:

(1) tracking a number of times a portion of the memory has been cycled and storing the number as a cycle count in an allocated fourth portion of the memory;

(2) minimizing cycling distributions between physical erase blocks of the memory by choosing for reclamation a portion of the memory with a lowest cycle count.

13. The processor-controlled method of claim 11, further comprising the step of storing in a fourth portion of the memory information as to a total number of physical erase blocks within the memory.

14. The processor-controlled method of claim 11, further comprising the step of storing in a fourth portion of the memory a checksum.

15. The processor-controlled method of claim 11, further comprising the step of storing in a fourth portion of the memory information regarding erase and write voltages.

16. A processor-controlled method of file management for a nonvolatile semiconductor first memory with a plurality of physical erase blocks, wherein bits of the first memory cannot be overwritten from a first logical state to a second logical state without a prior erasure, wherein erasure is by physical erase block and not on an individual byte basis, the method comprising the steps of:

(1) reclaiming memory space of the first memory by copying active files and not deleted files from a first portion of a first physical erase block of the first memory to a random access memory, then erasing the first physical erase block including the first portion, and then copying active files from the random access memory back to free space of the first physical erase block of the first memory;

(2) storing in a second portion of the first memory information as to whether a portion of the first memory is free for further data storage or in use;

(3) storing data in free space of the first memory in a sectored file structure.

\* \* \* \* \*

UNITED STATES PATENT AND TRADEMARK OFFICE
CERTIFICATE OF CORRECTION

PATENT NO. : 5,592,669
DATED : January 7, 1997
INVENTOR(S) : Robinson et al.

It is certified that error appears in the above-identified patent and that said Letters Patent is hereby corrected as shown below:

In column 28 at line 36 insert --548-- following "entries" and prior to "are"

Signed and Sealed this

Twelfth Day of August, 1997

Attest:

BRUCE LEHMAN

Attesting Officer

Commissioner of Patents and Trademarks